(12) United States Patent
Shirao et al.

(10) Patent No.: US 9,668,346 B2
(45) Date of Patent: May 30, 2017

(54) FLEXIBLE PRINTED CIRCUIT BOARD AND CIRCUIT-BOARD CONNECTION STRUCTURE

(71) Applicant: Mitsubishi Electric Corporation, Chiyoda-ku (JP)

(72) Inventors: Mizuki Shirao, Tokyo (JP); Nobuo Ohata, Tokyo (JP); Nobuyuki Yasui, Tokyo (JP); Hiroshi Aruga, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 917 days.

(21) Appl. No.: 14/037,645

(22) Filed: Sep. 26, 2013

(65) Prior Publication Data
US 2014/0085856 A1 Mar. 27, 2014

(30) Foreign Application Priority Data

Sep. 27, 2012 (JP) .................................. 2012-213913
Jul. 30, 2013 (JP) .................................. 2013-158235

(51) Int. Cl.
*H05K 1/11* (2006.01)
*H01P 3/00* (2006.01)
(Continued)

(52) U.S. Cl.
CPC .............. *H05K 1/118* (2013.01); *H01P 3/003* (2013.01); *H01P 3/081* (2013.01); *H01P 5/028* (2013.01);
(Continued)

(58) Field of Classification Search
CPC ........ H01P 3/003; H01P 3/0181; H01P 5/028; H05K 1/118; H05K 3/361; H05K 3/4038;
(Continued)

(56) References Cited

U.S. PATENT DOCUMENTS 7,145,411 B1 * 12/2006 Blair ...................... H01P 3/006
333/247
2004/0264882 A1 12/2004 Torigoe et al.
(Continued)

FOREIGN PATENT DOCUMENTS

JP 63-141274 A 6/1988
JP 2005-26801 A 1/2005
(Continued)

OTHER PUBLICATIONS

Office Action issued Dec. 6, 2016 in Japanese Patent Application No. 2013-158235 (with English language translation).

Primary Examiner — Jenny L Wagner
Assistant Examiner — Michael E Moats, Jr.
(74) Attorney, Agent, or Firm — Oblon, McClelland, Maier & Neustadt, L.L.P.

(57) ABSTRACT

A terminal portion configured to obtain electrical connection with a printed circuit board includes a first signal pad that is formed in a first conductor layer and is electrically separated from a ground layer, a pair of first ground pads that is formed in the first conductor layer to sandwich the first signal pad and is connected to the ground layer, a second signal pad that is formed in a second conductor layer and is connected to a signal line, a pair of second ground pads that is formed in the second conductor layer to sandwich the second signal pad and is electrically separated from the signal line, a third signal pad formed in a third conductor layer, and a pair of third ground pads formed in the third conductor layer to sandwich the third signal pad. The second signal pad is wider than the third signal pad.

22 Claims, 24 Drawing Sheets

(51) Int. Cl.
*H01P 3/08* (2006.01)
*H01P 5/02* (2006.01)
*H05K 1/02* (2006.01)
*H05K 3/36* (2006.01)

(52) U.S. Cl.
CPC ......... *H05K 1/0251* (2013.01); *H05K 1/0245* (2013.01); *H05K 1/0253* (2013.01); *H05K 3/363* (2013.01); *H05K 2201/0969* (2013.01); *H05K 2201/09181* (2013.01); *H05K 2201/09481* (2013.01); *H05K 2201/09609* (2013.01); *H05K 2201/09618* (2013.01); *H05K 2201/09727* (2013.01)

(58) Field of Classification Search
CPC ..... H05K 2201/07; H05K 2201/01945; H05K 2201/09372; H05K 2201/09481; H05K 2201/09818; H05K 2201/09354; H05K 2201/09145; H05K 2201/095; H05K 2201/096
USPC ................................. 174/254, 262; 257/678
See application file for complete search history.

(56) References Cited

U.S. PATENT DOCUMENTS

| | | |
|---|---|---|
| 2006/0027909 A1 | 2/2006 | Kobayashi |
| 2007/0026710 A1* | 2/2007 | Inoue ................... G01R 1/0735 439/161 |
| 2012/0138340 A1 | 6/2012 | Kato et al. |
| 2012/0274423 A1 | 11/2012 | Kato |
| 2014/0166344 A1 | 6/2014 | Kato et al. |
| 2015/0173184 A1 | 6/2015 | Kato et al. |

FOREIGN PATENT DOCUMENTS

| | | |
|---|---|---|
| JP | 2005-56801 | 3/2005 |
| JP | 2006-24618 A | 1/2006 |
| JP | 2006-73994 | 3/2006 |
| JP | 2007-123742 | 5/2007 |
| JP | 2008-288516 A | 11/2008 |
| JP | 2010-212617 | 9/2010 |
| JP | 2011-66223 A | 3/2011 |
| JP | 3173143 U | 1/2012 |
| JP | 2013-26601 | 2/2013 |
| WO | WO 2011/018979 A1 | 2/2011 |

\* cited by examiner

FLEXIBLE PRINTED CIRCUIT BOARD AND CIRCUIT-BOARD CONNECTION STRUCTURE

BACKGROUND OF THE INVENTION

1. Field of the Invention

The present invention relates to a flexible printed circuit board and a circuit-board connection structure in which a flexible printed circuit board is solder-mounted on a printed circuit board.

2. Description of the Related Art

In an optical transmission/reception module having a flexible printed circuit (FPC) board as an electrical interface, a high-speed signal at tens of Gbps is transmitted through a connection portion between a printed circuit board and the FPC board. As the FPC board, typically, a two-layer FPC board in which a base material is made of polyimide and which has a microstrip line structure composed of a transmission line and a ground layer is used. The transmission line is configured as a single-phase line or differential lines. To connect the FPC board and a printed circuit board, direct coupling by soldering is used.

In a technique described in Japanese Patent Application Laid-open No. 2007-123742, a ground line just under a signal line is partially removed to achieve impedance matching at the connection portion. In a technique described in Japanese Patent Application Laid-open No. 2010-212617, inductance components occurring at high frequencies are reduced by devising a wiring pattern to improve reflection and pass characteristics. In the structure described in Japanese Patent Application Laid-open No. 2010-212617, a wiring portion for connecting a transmission line portion and a terminal portion of an FPC board to each other is formed wider than a line width of the transmission line portion to increase the capacitance, thereby reducing an influence of the inductance occurring at a connection portion between a printed circuit board and the FPC board.

However, the technique described in Japanese Patent Application Laid-open No. 2010-212617 does not provide a shape that reduces the inductance of the terminal portion itself, which is the connection portion between the printed circuit board and the FPC board. Accordingly, the inductance is increased in a high-speed signal at 40 Gbps or the like and reflection is increased, resulting in increase in jitter in a signal passing through an optical module.

To solve these problems, the following measures (1) and (2) have been adopted. (1) To increase a signal pad width in the FPC board. (2) To reduce a distance between pads.

When the signal pad width is increased to about 0.8 millimeter, a connection with low reflection of −20 decibels or lower is obtained until at 40 gigahertz. However, considering positional misalignment from an ideal position occurring when the FPC board is soldered to the printed circuit board, the pad distance and the pad width of the FPC board need to be in a size that causes no short circuit with adjacent pads. For these reasons, the pad pitch and the pad width have to be set about 0.8 millimeter and 0.4 millimeter, respectively, as described in Japanese Patent Application Laid-open No. 2010-212617, and thus the inductance reduction measures such as increasing the pad width and reducing the pad distance are difficult to adopt.

SUMMARY OF THE INVENTION

It is an object of the present invention to at least partially solve the problems in the conventional technology.

According to an aspect of the present invention, a flexible printed circuit board having a multilayer structure in which first, second, and third conductor layers are stacked with a dielectric layer therebetween, includes a terminal portion configured to obtain an electrical connection with a printed circuit board; and a transmission line portion having a transmission line to be connected to the printed circuit board through the terminal portion formed therein, wherein the transmission line is formed of a ground layer formed in the first conductor layer and a signal line formed in the second conductor layer in parallel with the ground layer, the terminal portion includes a first signal pad that is formed in the first conductor layer and is electrically separated from the ground layer, a pair of first ground pads that is formed in the first conductor layer and is arranged such that the first ground pads sandwich the first signal pad from both sides thereof, a second signal pad that is formed in the second conductor layer such that the second signal pad is connected to the signal line, a pair of second ground pads that is formed in the second conductor layer, is electrically separated from the signal line, and is arranged such that the second ground pads sandwich the second signal pad from both sides thereof, a third signal pad that is formed in the third conductor layer, a pair of third ground pads that is formed in the third conductor layer and is arranged such that the third ground pads sandwich the third signal pad from both sides thereof, a ground via that connects the first ground pads, the second ground pads, and the third ground pads with each other, and a signal via that connects the first signal pad, the second signal pad, and the third signal pad with each other, the pairs of first, second, and third ground pads are electrically connected to the ground layer, and the second signal pad is wider than the third signal pad.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a flexible printed circuit (FPC) board according to the present invention will be explained below in detail with reference to the accompanying drawings. The present invention is not limited to the embodiments.

First Embodiment

Figure 1:
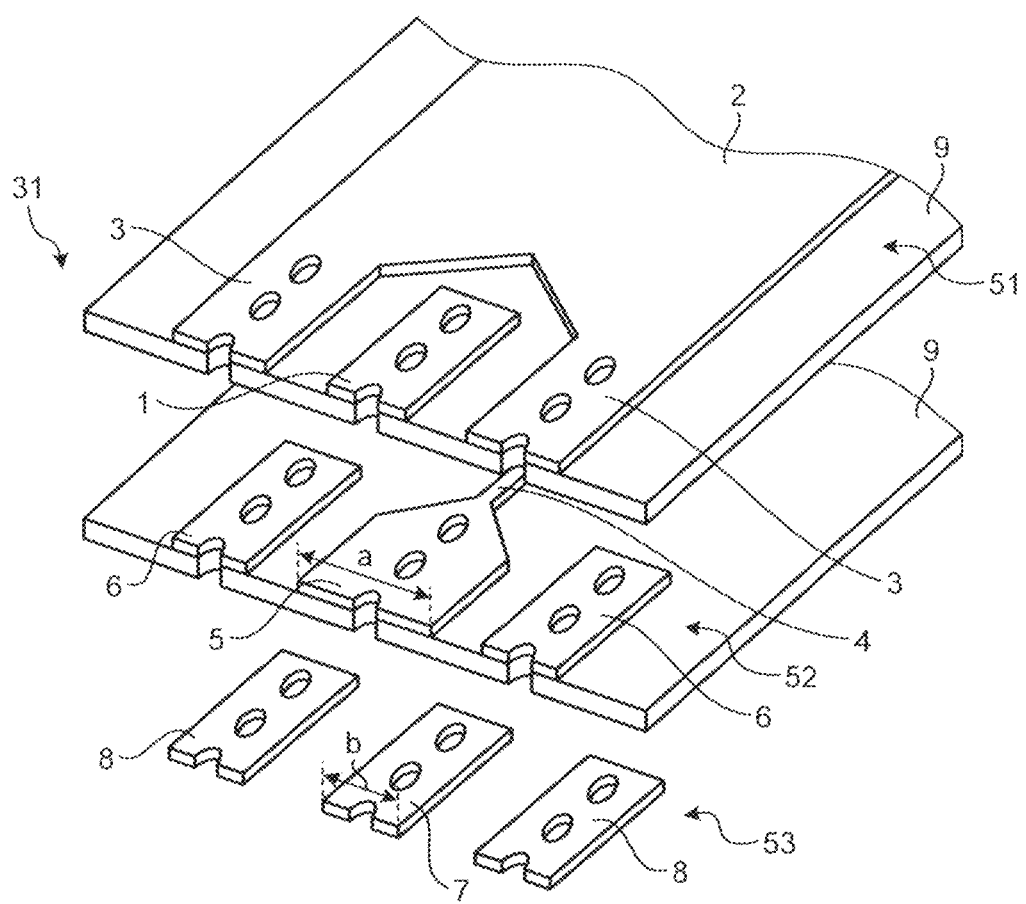
FIG. 1 is an exploded perspective view of a layer configuration of an FPC board according to a first embodiment of the present invention.
Figure 2:
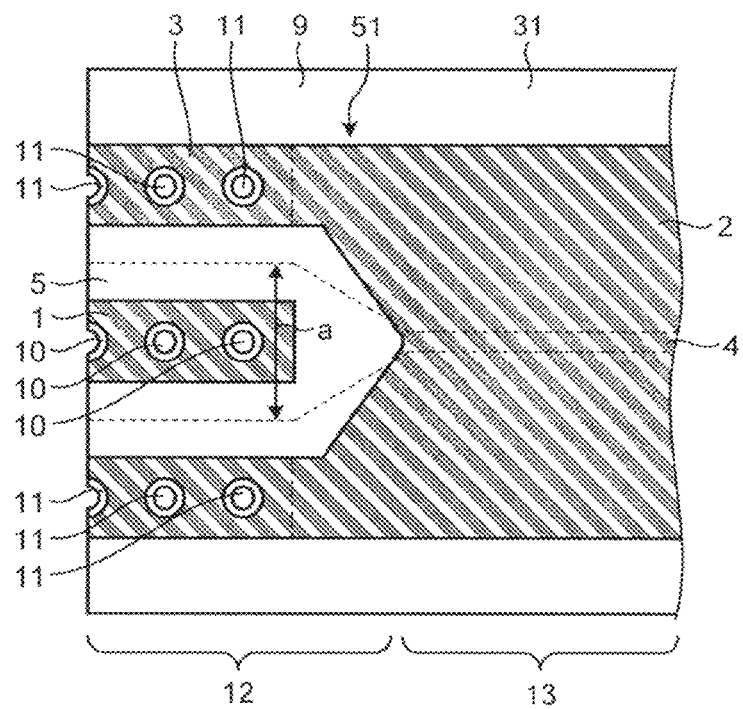
FIG. 2 is a diagram of a pattern layout of the FPC board.

FIG. 1 is an exploded perspective view of a layer configuration of an FPC board according to a first embodiment of the present invention. FIG. 2 is a diagram of a pattern layout of the FPC board and depicts a side of the FPC board not to be soldered to a printed circuit board.

Figure 3:
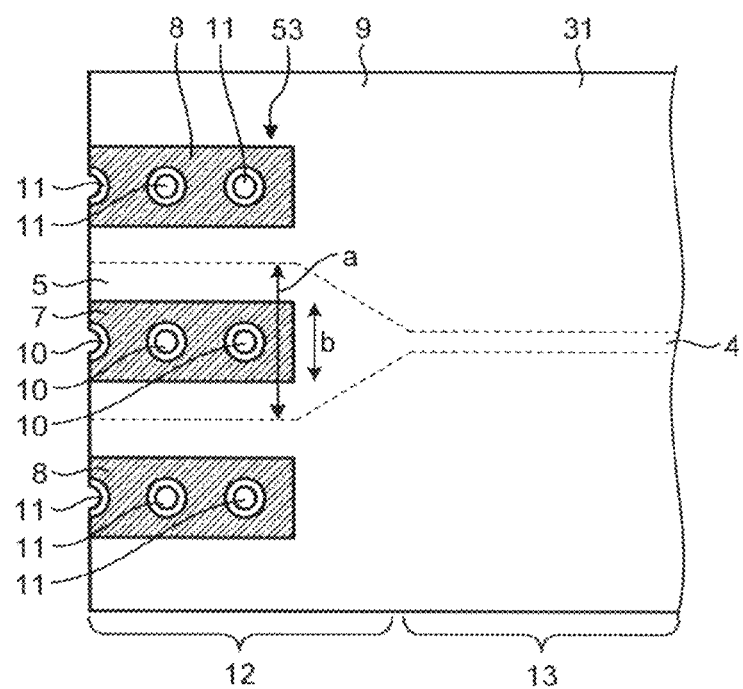
FIG. 3 is a diagram of a pattern layout of the FPC board.
Figure 4:
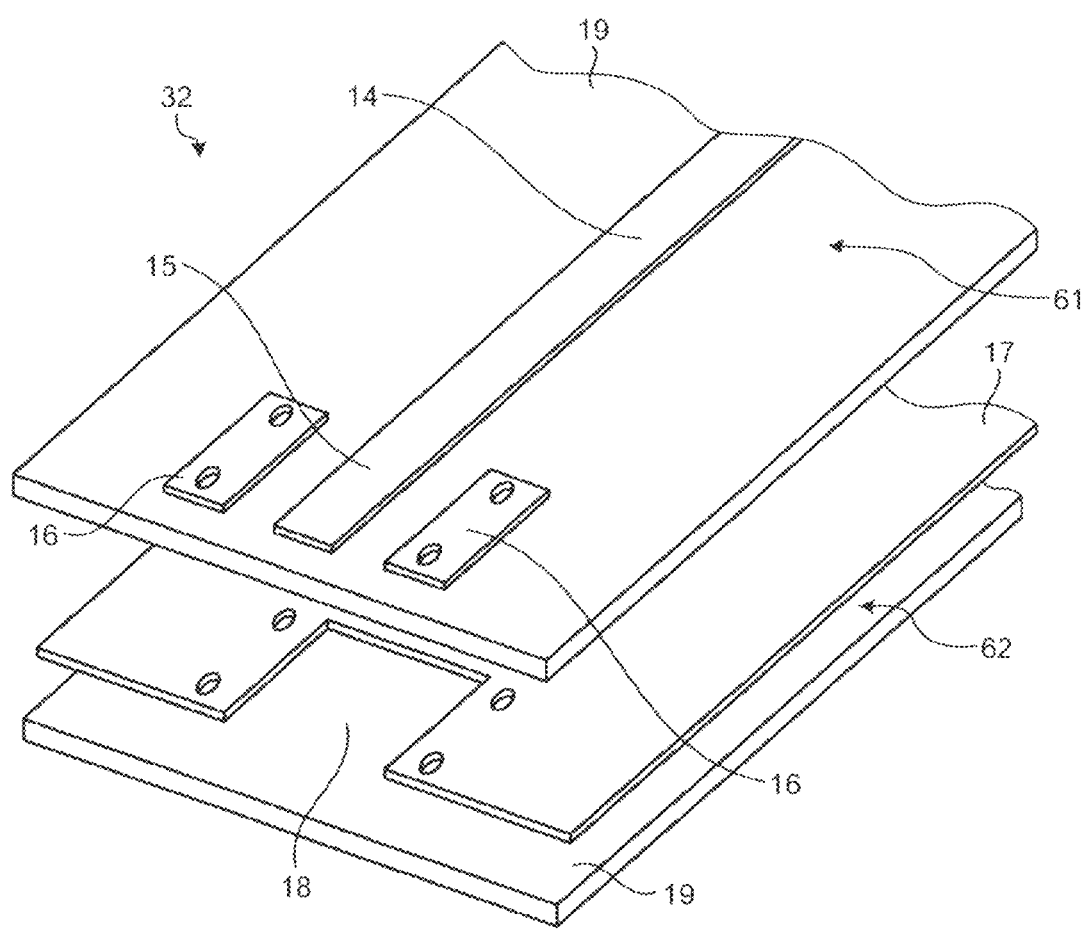
FIG. 4 is an exploded perspective view of a layer configuration of a printed circuit board.

FIG. 3 is a diagram of a pattern layout of the FPC board and depicts a side of the FPC board to be soldered to a printed circuit board. FIG. 4 is an exploded perspective view of a layer configuration of a printed circuit board.

Figure 5:
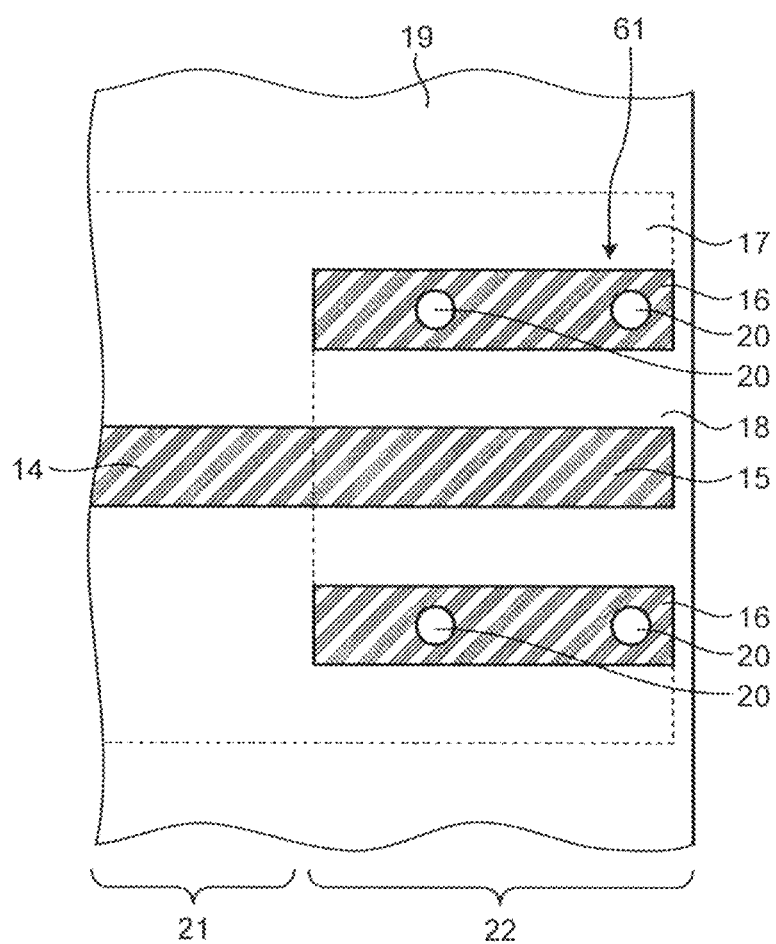
FIG. 5 is a diagram of a pattern layout of the printed circuit board.
Figure 6:
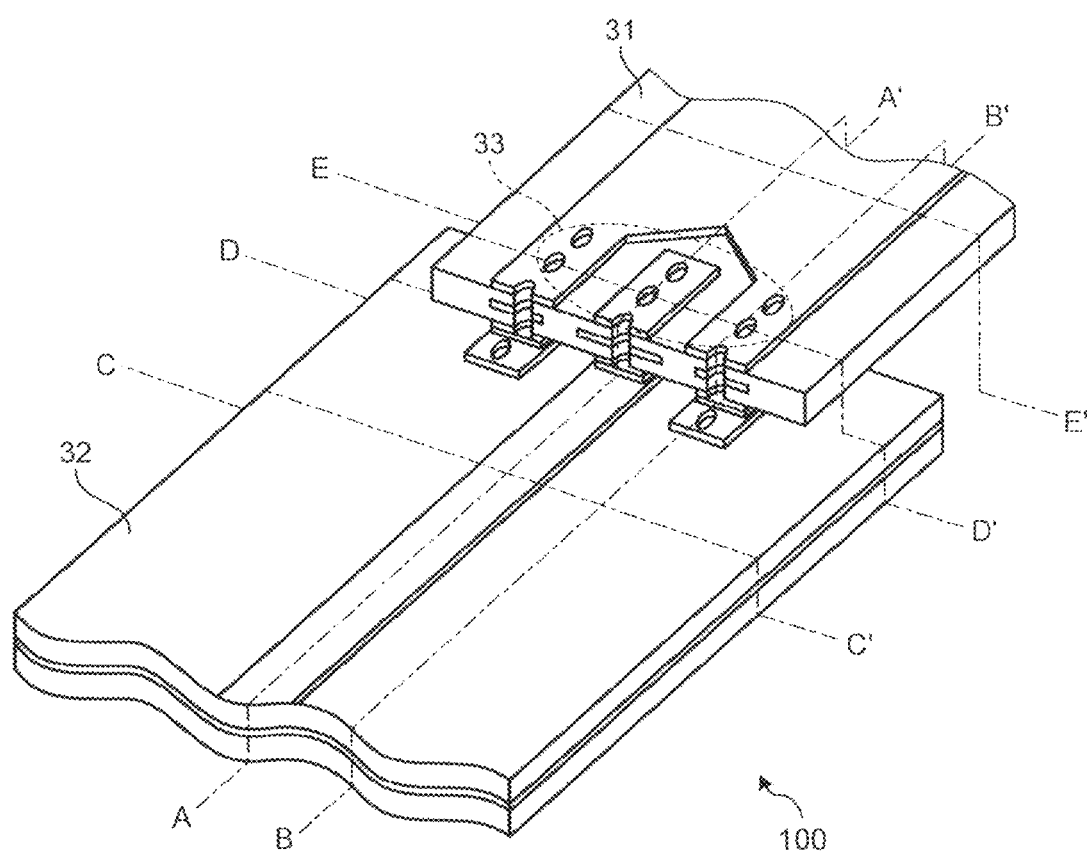
FIG. 6 is a perspective view of a circuit-board connection structure using the FPC board according to the first embodiment.
Figure 7A:
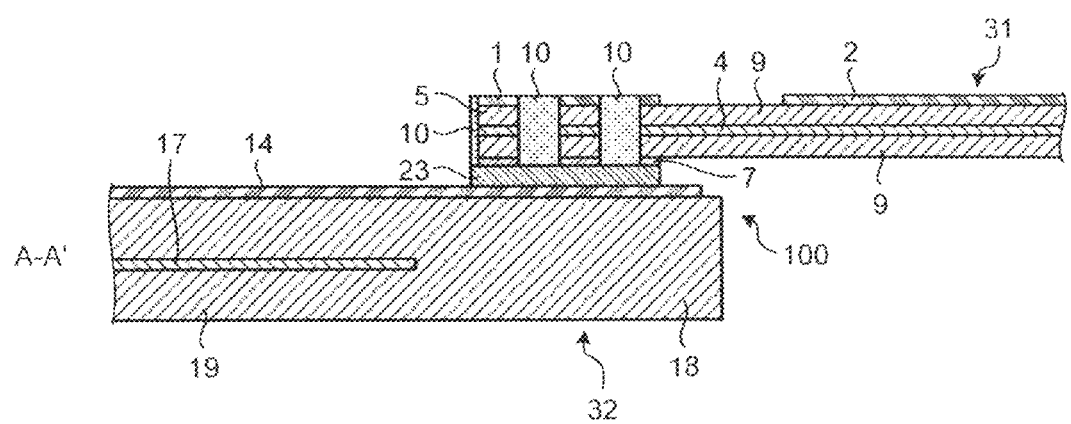
FIG. 7A is a cross-sectional view of the circuit-board connection structure using the FPC board according to the first embodiment.
Figure 7B:
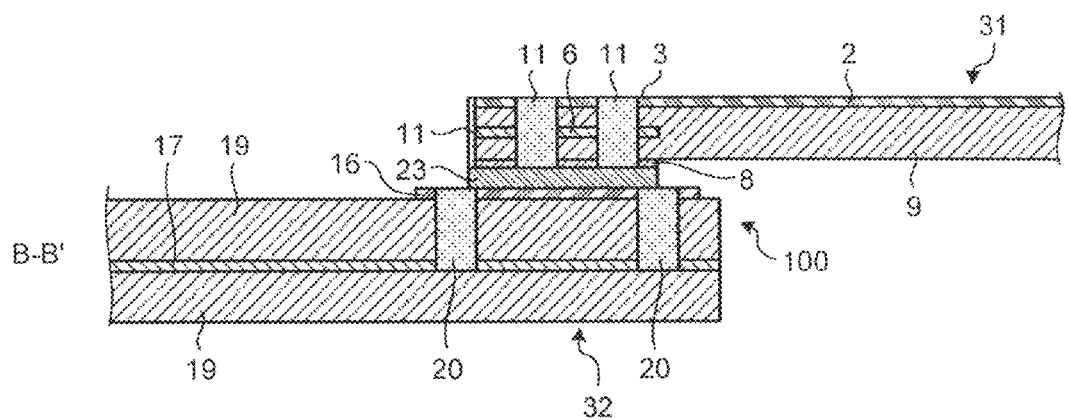
FIG. 7B is a cross-sectional view of the circuit-board connection structure using the FPC board according to the first embodiment.
Figure 7C:
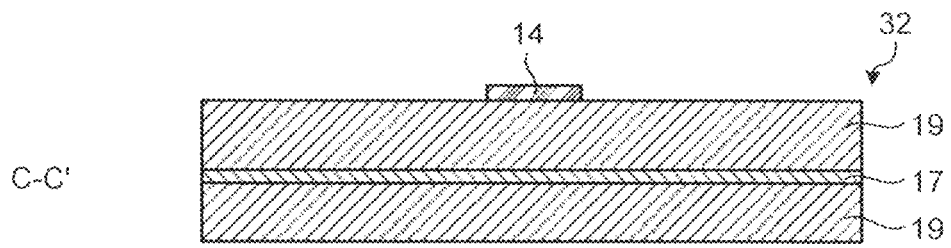
FIG. 7C is a cross-sectional view of the circuit-board connection structure using the FPC board according to the first embodiment.
Figure 7D:
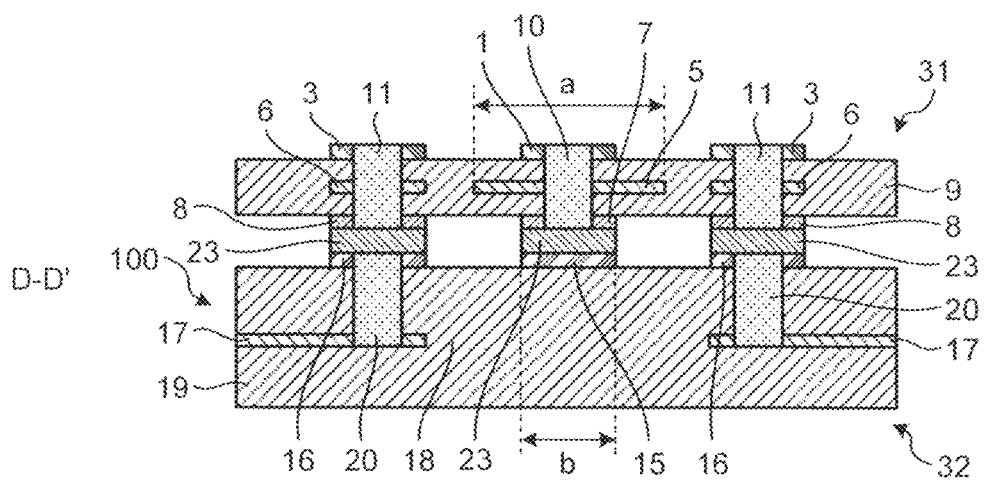
FIG. 7D is a cross-sectional view of the circuit-board connection structure using the FPC board according to the first embodiment.
Figure 7E:
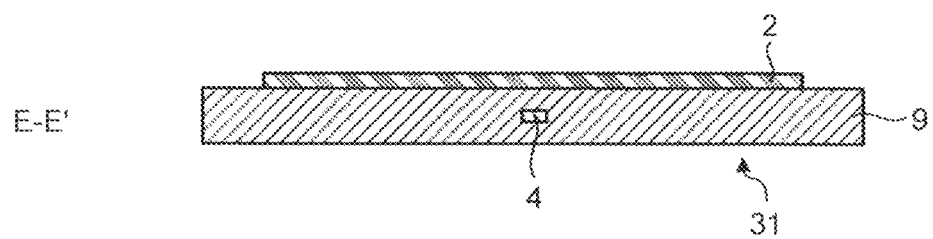
FIG. 7E is a cross-sectional view of the circuit-board connection structure using the FPC board according to the first embodiment.

FIG. 5 is a diagram of a pattern layout of the printed circuit board. FIG. 6 is a perspective view of a circuit-board connection structure using the FPC board according to the first embodiment. FIGS. 7A to 7E are cross-sectional views of the circuit-board connection structure using the FPC board according to the first embodiment. FIG. 7A depicts a cross-section taken along line A-A' in FIG. 6, FIG. 7B depicts a cross-section taken along line B-B' in FIG. 6, FIG. 7C depicts a cross-section taken along line C-C' in FIG. 6, FIG. 7D depicts a cross-section taken along line D-D' in FIG. 6, and FIG. 7E depicts a cross-section taken along line E-E' in FIG. 6. The "circuit-board connection structure" in this case indicates a structure body in which the FPC board and the printed circuit board are joined by solder.

An FPC board 31 is configured to include three conductor layers of a first conductor layer 51, a second conductor layer 52, and a third conductor layer 53, and a versatile polyimide base is used as a dielectric layer 9 between adjacent ones of the conductor layers. Liquid crystalline polyimide having an excellent high-frequency characteristic can be used as the dielectric layer 9.

The FPC board 31 includes a terminal portion 12 for obtaining an electrical connection with outside and a transmission line portion 13 that transmits a signal. The transmission line portion 13 is formed as a microstrip line between a ground layer 2 provided in the first conductor layer 51 and a signal line 4 provided in the second conductor layer 52. The terminal portion 12 includes a first signal pad 1 and a pair of first ground pads 3, which are provided in the first conductor layer 51, a second signal pad 5 and a pair of second ground pads 6, which are provided in the second conductor layer 52, and a third signal pad 7 and a pair of third ground pads 8, which are provided in the third conductor layer 53. In the terminal portion 12, the first ground pads 3, the second ground pads 6, and the third ground pads 8 are connected through ground vias 11. The first signal pad 1, the second signal pad 5, and the third signal pad 7 are connected through signal vias 10. The first ground pads 3 extend to the transmission line portion 13 and the first ground pads 3 and the ground layer 2 are connected in the first conductor layer 51. In the first embodiment, while a width b of the third signal pad 7 is set as "b=0.4 millimeter", a width a of the second signal pad 5 is set as "a=0.8 millimeter", which is wider than 0.4 millimeter, and a coplanar transmission line 33 is formed among the first ground pads 3, the second ground pads 6, and the third ground pads 8. While a pitch of the pads is set to 0.79 millimeter, for example, when the standard of XMD-MSA (10 Gbit/s Miniature Device Multi Source Agreement) is met, the pitch can be different from existing standards.

While the transmission line portion 13 is formed between the ground layer 2 formed in the first conductor layer 51 and the signal line 4 formed in the second conductor layer 52, the third conductor layer 53 has no pattern in the transmission line portion 13.

As shown in FIG. 3, the third conductor layer 53 includes only the third signal pad 7 and the third ground pads 8 in the terminal portion 12 and has no conductor pattern in the transmission line portion 13. In other words, no conductor is formed in the transmission line portion 13 of the third conductor layer 53. With this structure, the area of the patterns can be minimized and the flexibility of the FPC board 31 can be ensured.

According to the first embodiment, the pattern area is minimized, so that the FPC board 31 can be softened and easily mounted on a printed circuit board 32.

The printed circuit board 32 is configured to include at least two conductor layers of a first printed-circuit-board conductor layer 61 and a second printed-circuit-board conductor layer 62, and the first printed-circuit-board conductor layer 61 and the second printed-circuit-board conductor layer 62 are provided on the front and back of a printed-circuit-board dielectric layer 19, respectively, in this case. The printed circuit board 32 includes a printed-circuit-board terminal portion 22 for obtaining an electrical connection with outside and a printed-circuit-board transmission line portion 21. The printed-circuit-board transmission line portion 21 is formed as a microstrip line between a printed-circuit-board ground layer 17 provided in the second printed-circuit-board conductor layer 62 and a printed-circuit-board signal line 14 provided in the first printed-circuit-board conductor layer 61. The printed-circuit-board terminal portion 22 includes a printed-circuit-board signal pad 15 and a pair of printed-circuit-board ground pads 16 provided in the first printed-circuit-board conductor layer 61, and a printed-circuit-board ground-layer removed portion 18 provided in the second printed-circuit-board conductor layer 62 by partially not forming the printed-circuit-board ground layer 17. In the printed-circuit-board terminal portion 22, the printed-circuit-board ground pads 16 and the printed-circuit-board ground layer 17 are connected through printed-circuit-board ground vias 20.

The FPC board 31 is mounted on the printed circuit board 32 using solder 23 in such orientations that the third signal pad 7 and the printed-circuit-board signal pad 15 face each other and that the third ground pads 8 and the printed-circuit-board ground pads 16 face each other, thereby configuring a circuit-board connection structure 100. In this case, while a configuration in which the ground vias 11 and the signal vias 10 are exposed at an end of the FPC board 31 to enable the solder to easily flow between the FPC board 31 and the printed circuit board 32 at the time of soldering is shown as an example, the ground vias 11 and the signal vias 10 may not be exposed at the end of the FPC board 31. When the FPC board 31 is mounted on the printed circuit board 32, a method of pouring solder through the signal vias 10 and the ground vias 11 from the surface (the surface on which the first signal pad 1 and the first ground pads 3 are provided in this case) opposite to the third signal pad 7 and the third ground pads 8, which are the surfaces that contact the printed circuit board 32, is adopted.

Although not shown in the drawings, the opposite side of the FPC board 31 to the terminal portion 12 is connected to, for example, a box-type package to be applied to an optical module.

An operation thereof is explained next. Although the direction of a current is explained in the first embodiment while assuming that the circuit-board connection structure 100 is applied to an optical transmission module, the circuit-board connection structure 100 can also be applied to an optical reception module and the direction of a current in this case is opposite to that in the following explanations.

When a signal propagates through the printed-circuit-board transmission line portion 21, a signal current flows through the printed-circuit-board signal line 14 and a feedback current flows through the printed-circuit-board ground layer 17. At the connection portion between the terminal portion 12 and the printed-circuit-board terminal portion 22, the signal current is transmitted from the printed-circuit-board signal pad 15 through the third signal pad 7 and the signal vias 10 to the second signal pad 5. The feedback current flows from the first ground pads 3 through the ground vias 11 to the second ground pads 6 and the third ground pads 8 and then flows from the printed-circuit-board ground pads 16 through the printed-circuit-board ground vias 20 to the printed-circuit-board ground layer 17, thereby circumventing the printed-circuit-board ground-layer removed portion 18. As a result, the signal current and the feedback current flow in parallel with each other in the terminal portion 12. Although the first signal pad 1 is necessary for pouring the solder from the side of the first signal pad 1 through the signal vias 10 at the time of mounting the FPC board 31 on the printed circuit board 32 as mentioned above, the first signal pad 1 does not contribute to the flow of the signal current.

In the first embodiment, the terminal portion 12 is designed in such a manner that the width a of the second signal pad 5 is set as "a=0.8 millimeter", which is wider than the width b of the third signal pad 7, being set as "b=0.4 millimeter", to couple the first ground pads 3, the second ground pads 6, and the third ground pads 8 with the second signal pad 5, thereby forming the coplanar transmission line 33, and that impedance matching is achieved in a state where the terminal portion 12 and the printed-circuit-board terminal portion 22 are soldered.

Figure 8:
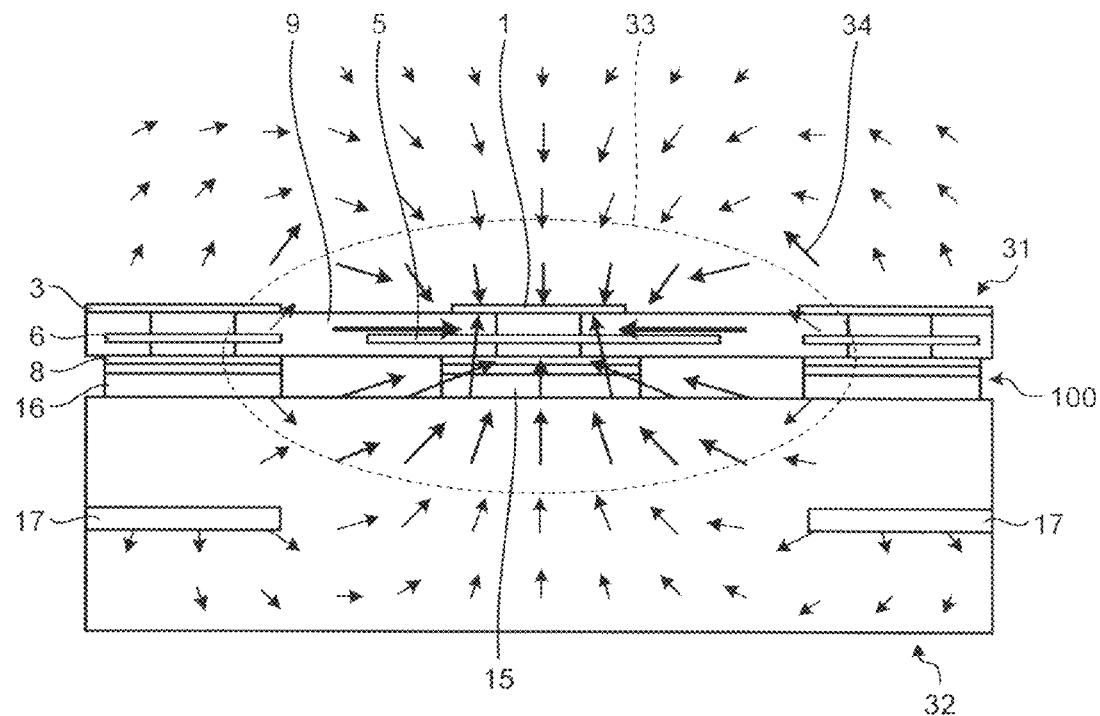
FIG. 8 is a diagram of a state of an electric field at the connection portion between an FPC board and a printed circuit board.

FIG. 8 is a diagram of a state of an electric field at the connection portion between an FPC board and a printed circuit board. Arrows in FIG. 8 denote electric field vectors 34 and indicate directions and magnitudes of the electric field. As shown in FIG. 8, the electric field vectors 34 are the largest between the first ground pads 3, the second ground pads 6, and the third ground pads 8 and the second signal pad 5, and the coplanar transmission line 33 is formed in the horizontal direction of the circuit board.

In the transmission line portion 13, the signal current flows through the signal line 4 and the feedback current flows through the ground layer 2.

In a conventional FPC board with a two-layer structure, solder mounting is performed using signal and ground pads that are formed on the same conductor layer (referred to as an "SIG layer" for convenience sake) as a signal line. Therefore, when the width of the signal pad in the SIG layer is increased, the signal pad may be short-circuited with the ground pad on the SIG layer at the time of solder mounting. Accordingly, in the conventional FPC board with a two-layer structure, the pad width is limited to about the width of the terminal described in Japanese Patent Application Laid-open No. 2010-212617 (about 0.4 millimeter) to prevent short circuit at the time of solder mounting. In the first embodiment, the second signal pad 5 is formed as an internal-layer wire due to a three-layer structure, and thus the pad width can be increased while the short circuit at the time of mounting is prevented. In this way, when the terminal portion 12 is formed as a three-layer structure to form a wide signal pattern as an internal layer, the impedance-matched coplanar transmission line 33 can be formed.

Figure 9:
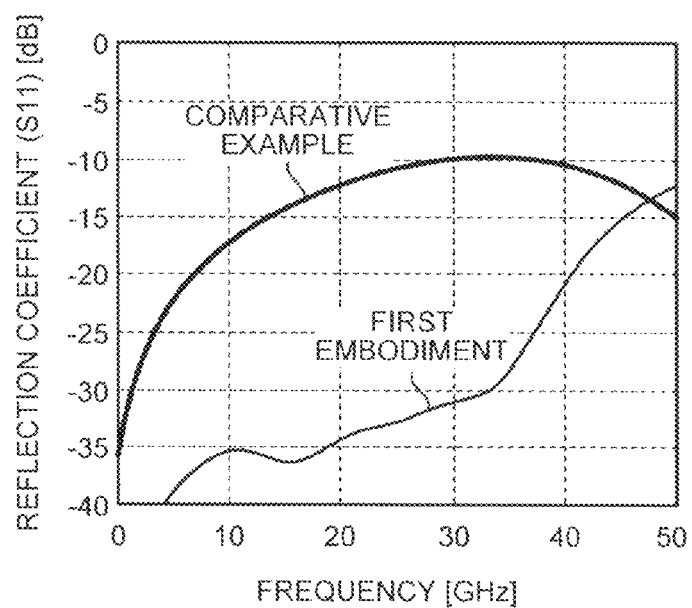
FIG. 9 is a graph of reflection characteristics of a circuit-board connection structure.

FIG. 9 is a graph of reflection characteristics of a circuit-board connection structure, where the vertical axis represents a reflection coefficient (S11) and the horizontal axis represents a frequency. To describe a difference in the reflection characteristics due to the widths of the second and third signal pads, the reflection characteristics in a comparative example in which the width a of the second signal pad 5 is 0.4 millimeter and the width b of the third signal pad 7 is 0.4 millimeter are also shown. In the comparative example, reflection of a maximum of 10 decibels occurs at a frequency band equal to or lower than 40 gigahertz as shown in FIG. 9. On the other hand, in the configuration according to the first embodiment in which the width a of the second signal pad 5 is set to 0.8 millimeter and the width b of the third signal pad 7 is set to 0.4 millimeter to form the impedance-matched coplanar transmission line 33, the reflection is greatly reduced as compared to the comparative example and a connection with low reflection in which the reflection coefficient (S11) is −20 decibels until at 40 gigahertz is achieved.

In the first embodiment, the terminal portion 12 of the FPC board 31 is configured in three layers and the width of the second signal pad 5 is increased, so that the impedance-matched coplanar transmission line 33 can be formed in the terminal portion 12 while short circuit due to positional misalignment at the time of mounting is prevented. Therefore, an output waveform of the optical module can be stabilized and the amount of jitter can be reduced.

In the case of the optical module with a box-type package, a connection with low loss can be realized using a coaxial cable instead of the FPC board; however, use of the FPC board can downsize and lighten the optical module and facilitates transportation compared to the configuration using the coaxial cable. When the downsizing is realized, usage of a packaging material can be reduced and transport efficiency can be enhanced compared to the configuration using the coaxial cable. Furthermore, because waste materials of the FPC board are fewer than those of the coaxial cable, environmental burdens are reduced in the life cycle of the optical module.

Second Embodiment

Figure 10:
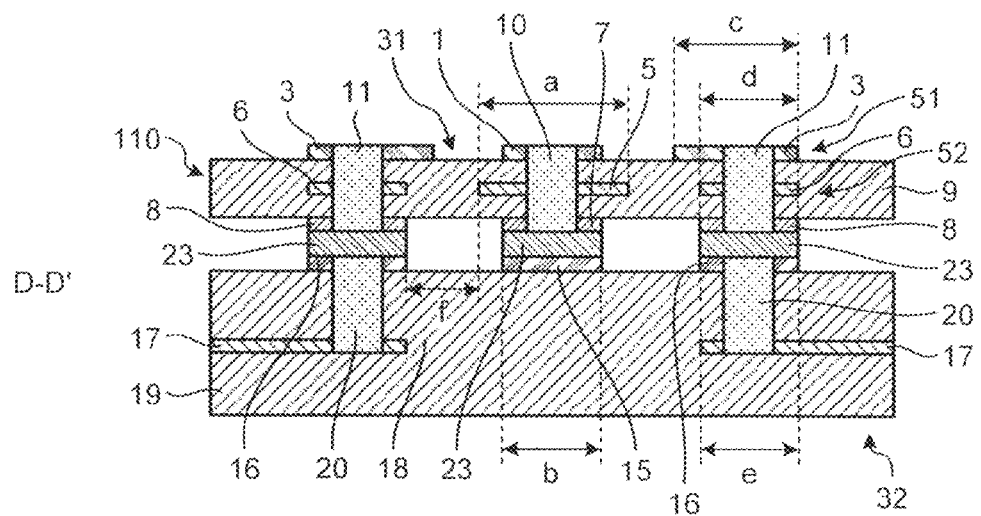
FIG. 10 is a cross-sectional view of a configuration of an FPC board according to a second embodiment of the present invention.

The overall configuration of a circuit-board connection structure according to a second embodiment of the present invention is substantially identical to that of the first embodiment, and therefore only differences between these embodiments are explained below and redundant explanations thereof will be omitted. FIG. 10 is a cross-sectional view of a configuration of an FPC board according to the second embodiment of the present invention and depicts a cross-section corresponding to the D-D' cross-section of the circuit-board connection structure 100 according to the first embodiment shown in FIG. 6. While the structure according to the first embodiment requires that the width of the second signal pad 5 is larger than that of the third signal pad 7 (a>b), the width of the first ground pads 3 may be increased. In a circuit-board connection structure 110 according to the second embodiment, the second signal pad 5 of the FPC board 31 is wider than the third signal pad 7, and the first ground pads 3 are wider than the third ground pads 8 and are arranged to project toward the first signal pad 1.

Formation of the coplanar transmission line 33 with the terminal portion 12 and the printed-circuit-board terminal portion 22 is the same as that in the first embodiment. Because the first ground pads 3 are wider than the second ground pads 6 and the third ground pads 8, coupling between the second signal pad 5 and the first ground pads 3 is the strongest. The transmission line portion 13 is formed in the FPC board 31 between the ground layer 2 provided in the first conductor layer 51 and the signal line 4 provided in the second conductor layer 52. Accordingly, when the coupling between the first ground pads 3 on the same layer as the ground layer 2 (the first conductor layer 51) and the second signal pad 5 on the same layer as the signal line 4 (the second conductor layer 52) is strengthened, the feedback current can be flowed smoothly from the terminal portion 12 to the transmission line portion 13.

Generally, a manufacturing error in the FPC board is relatively large and positional misalignment of a maximum of about 0.1 millimeter may occur between conductor layers. In the second embodiment, the first ground pads 3 are formed wider than the second ground pads 6 and the third ground pads 8, and thus the coupling between the first ground pads 3 and the second signal pad 5 can be the strongest, for example, even when the third ground pads 8 are horizontally misaligned toward the second signal pad 5. Accordingly, degradation in the reflection and pass characteristics due to a manufacturing error can be prevented without being influenced by positional misalignment of the third ground pads 8 in the horizontal direction.

Assuming as an example that the width a of the second signal pad 5, the width b of the third signal pad 7, and a width d of the second ground pads 6 and the third ground pads 8 are set as "a=0.6 millimeter", "b=0.4 millimeter", and "d=0.4 millimeter", respectively, and a width c of the first ground pads 3 is set as "c=0.5 millimeter" by extending the first ground pads 3 toward the second signal pad 5 by 0.1 millimeter, the distance between the first ground pads 3 and the second signal pad 5 is shorter than the distance between the third ground pads 8 and the second signal pad 5 even when positional misalignment equal to or smaller than 0.1 millimeter occurs in the third ground pads 8 in the horizontal direction, so that the coupling between the first ground pads 3 and the second signal pad 5 can be the strongest. Accordingly, even when positional misalignment occurs in the third ground pads 8 in the horizontal direction due to a manufacturing error, degradation in the reflection and pass characteristics does not occur when the magnitude of the misalignment is equal to or smaller than 0.1 millimeter.

Mounting positional misalignment of about 0.2 millimeter may occur at the time of soldering of the FPC board 31 and the printed circuit board 32. When the mounting positional misalignment occurs, the wider second signal pad 5 and the printed-circuit-board ground pads 16 may overlap with each other and capacitance components may be increased, which leads to impedance mismatching. In the second embodiment, the first ground pads 3 as well as the second signal pad 5 are formed wider, so that the width a of the second signal pad 5 of the impedance-matched coplanar transmission line 33 can be suppressed to about 0.6 millimeter, thereby avoiding the problem that the second signal pad 5 and the printed-circuit-board ground pads 16 significantly approach each other.

A horizontal distance f between the second signal pad 5 and the printed-circuit-board ground pad 16 has a value obtained by subtracting the sum of a half of the width a of the second signal pad 5 and a half of a width e of the printed-circuit-board ground pad 16 from the pad pitch. When "a=0.6 millimeter" as in the example mentioned above, f=0.79−(0.6+0.4)/2=0.29 millimeter where the width e of the printed-circuit-board ground pad 16 is 0.4 millimeter and the pad pitch is 0.79 millimeter. Therefore, 0.29 millimeter of the horizontal distance f between the second signal pad 5 and the printed-circuit-board ground pad 16 is ensured and accordingly a structure that does not cause the problem mentioned above can be achieved even when the mounting positional misalignment of 0.2 millimeter occurs.

According to the second embodiment, in the FPC board 31 having the wider second signal pad 5, degradation in the reflection and pass characteristics at the connection portion between the printed circuit board 32 and the FPC board 31 is suppressed when a manufacturing error occurs in the FPC board 31, so that resistance of the FPC board 31 to a manufacturing error is improved and a yield can be improved. Furthermore, characteristic degradation at the time when mounting positional misalignment occurs can be suppressed and an accuracy required in the mounting process is reduced, which enables simplification of the process.

Third Embodiment

Figure 11:
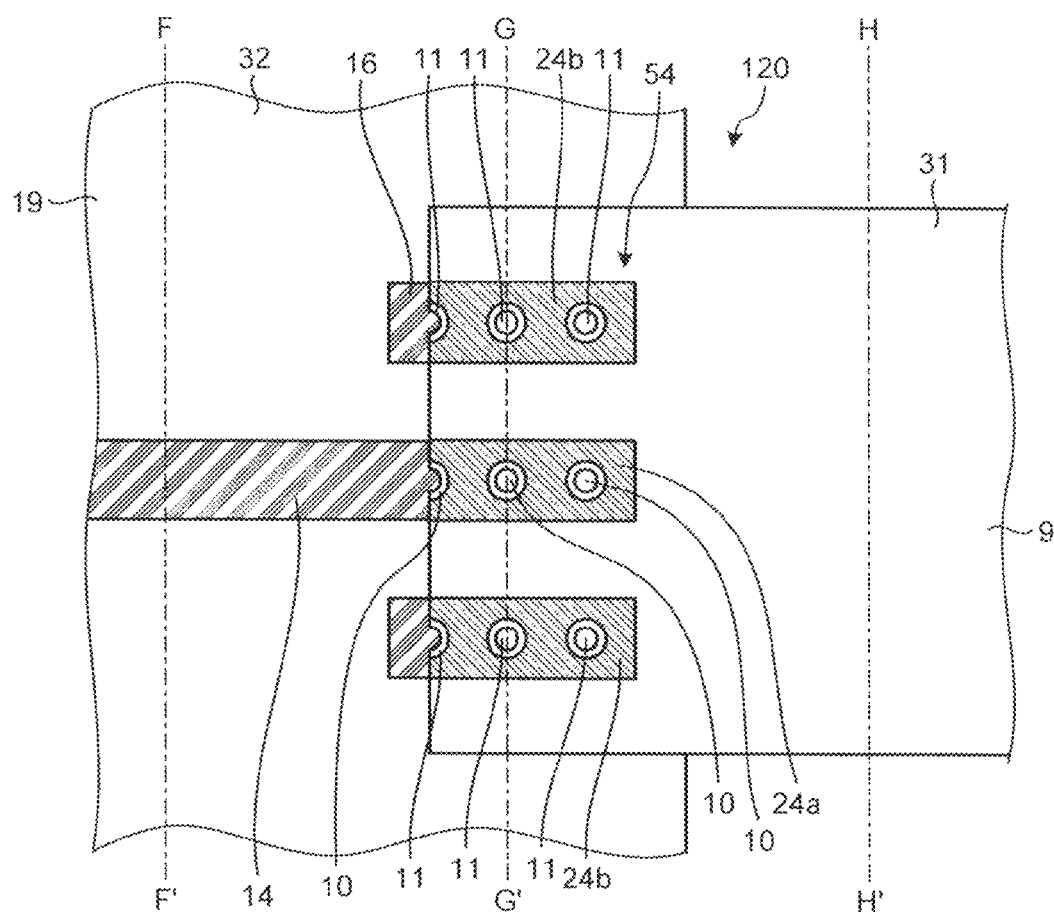
FIG. 11 is a plan view of a configuration of a circuit-board connection structure according to a third embodiment of the present invention.
Figure 12A:
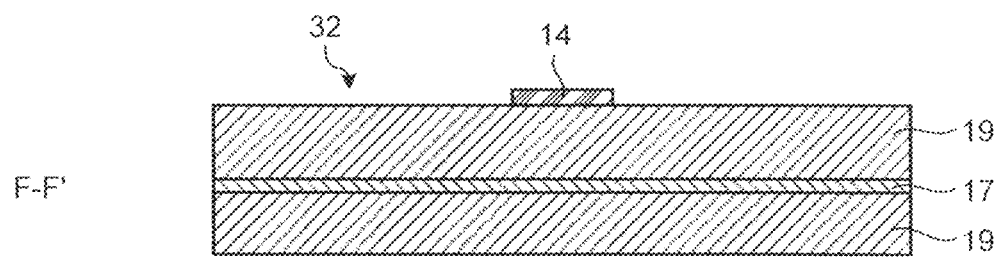
FIG. 12A is a cross-sectional view of a configuration of the circuit-board connection structure according to the third embodiment of the present invention.
Figure 12B:
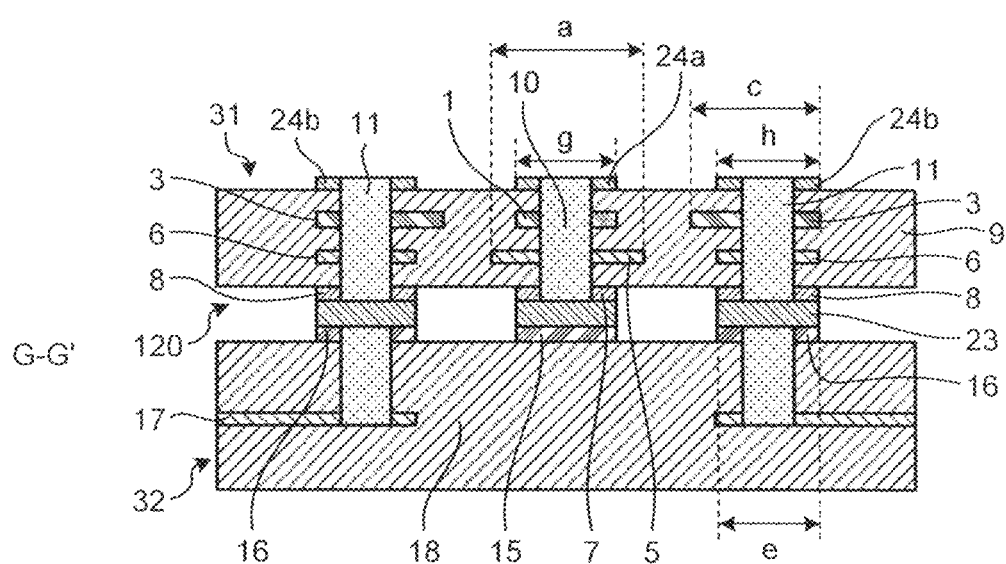
FIG. 12B is a cross-sectional view of a configuration of the circuit-board connection structure according to the third embodiment of the present invention.
Figure 12C:
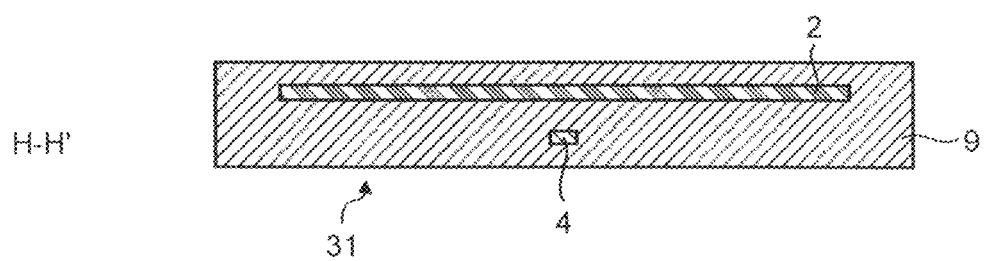
FIG. 12C is a cross-sectional view of a configuration of the circuit-board connection structure according to the third embodiment of the present invention.

The overall configuration of a circuit-board connection structure according to a third embodiment of the present invention is substantially identical to that of the second embodiment, and therefore only differences between these embodiments are explained below and redundant explanations thereof will be omitted. FIG. 11 is a plan view of a configuration of a circuit-board connection structure according to the third embodiment of the present invention. FIGS. 12A to 12C are cross-sectional views of a configuration of the circuit-board connection structure according to the third embodiment of the present invention. FIG. 12A depicts a cross-section taken along line F-F' in FIG. 11, FIG. 12B depicts a cross-section taken along line G-G' in FIG. 11, and FIG. 12C depicts a cross-section taken along line H-H' in FIG. 11. A circuit-board connection structure 120 according to the third embodiment is a four-layer structure in which a fourth conductor layer 54 is added to the FPC board 31 according to the second embodiment. In the fourth conductor layer 54, a fourth signal pad 24a and fourth ground pads 24b are additionally provided in the terminal portion 12. The first signal pad 1, the second signal pad 5, the third signal pad 7, and the fourth signal pad 24a are connected through the signal vias 10 in the terminal portion 12. The first ground pads 3, the second ground pads 6, the third ground pads 8, and the fourth ground pads 24b are connected through the ground vias 11 in the terminal portion 12.

The fourth signal pad 24a and the fourth ground pads 24b are formed in a configuration in which the coplanar transmission line 33 is formed by increasing the width a of the second signal pad 5 and the width c of the first ground pads 3, so that the second signal pad 5 and the first ground pads 3 are formed as internal-layer wires.

Flows of the signal current and the feedback current are the same as those in the first and second embodiments.

As mentioned above, at the time of mounting the FPC board 31 on the printed circuit board 32, the method of pouring solder through the signal vias 10 and the ground vias 11 from the surface opposite to the third signal pad 7 and the third ground pads 8, which are the surfaces that contact the printed circuit board 32, is adopted. At that time, when the pad pitch is small, adjacent ones of the pads are short-circuited by the solder. In the third embodiment, the fourth conductor layer 54 is provided to form the fourth signal pad 24a and the fourth ground pads 24b, thereby causing the first signal pad 1 and the first ground pads 3 to be an internal-layer wiring pattern. Accordingly, there is no need to consider occurrence of short circuit during soldering at the time of setting the width c of the first ground pads 3.

When a width g of the fourth signal pad 24a and a width h of the fourth ground pads 24b are set as "g=0.4 millimeter" and "h=0.4 millimeter" as an example, an enough distance between the fourth signal pad 24a and the fourth ground pads 24b can be ensured, and thus occurrence of short circuit between the fourth signal pad 24a and the fourth ground pads 24b can be prevented. Furthermore, because the first signal pad 1 and the first ground pads 3 are provided as an internal-layer wiring pattern, no short circuit occurs therebetween.

According to the third embodiment, short circuit at the time of pouring solder during mounting of the FPC board 31 on the printed circuit board 32, which is caused by reduction in the pad distance between the first signal pad 1 and the first ground pads 3, can be prevented and the yield can be improved.

Fourth Embodiment

Figure 13:
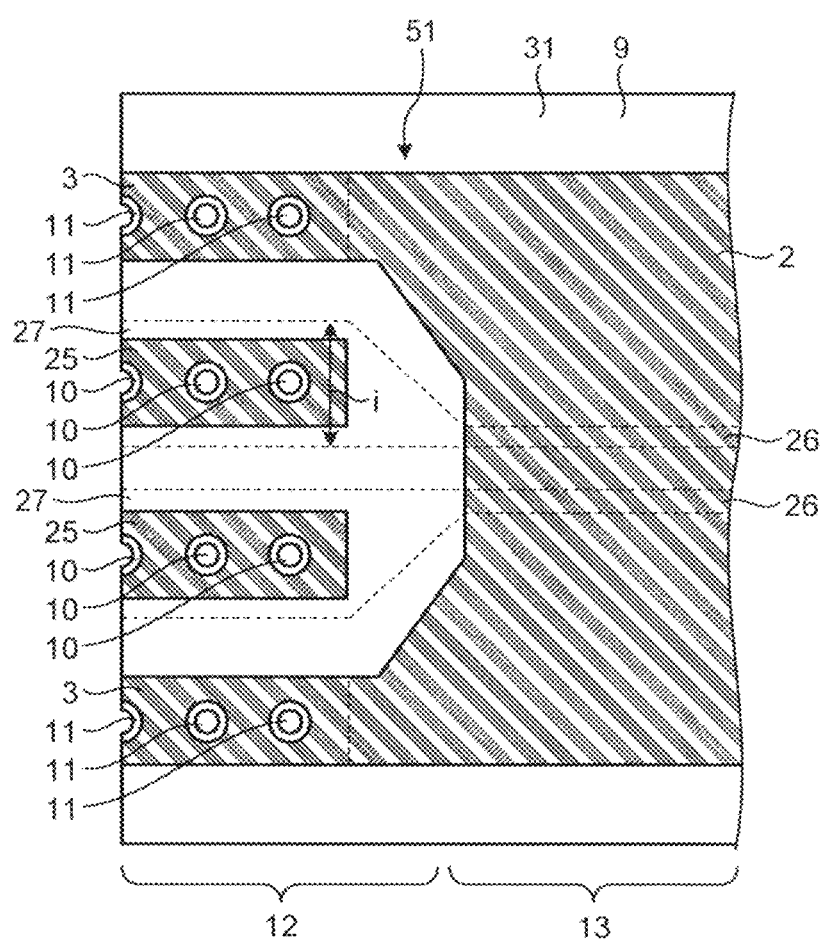
FIG. 13 is a diagram of a pattern layout of an FPC board according to a fourth embodiment of the present invention.
Figure 14:
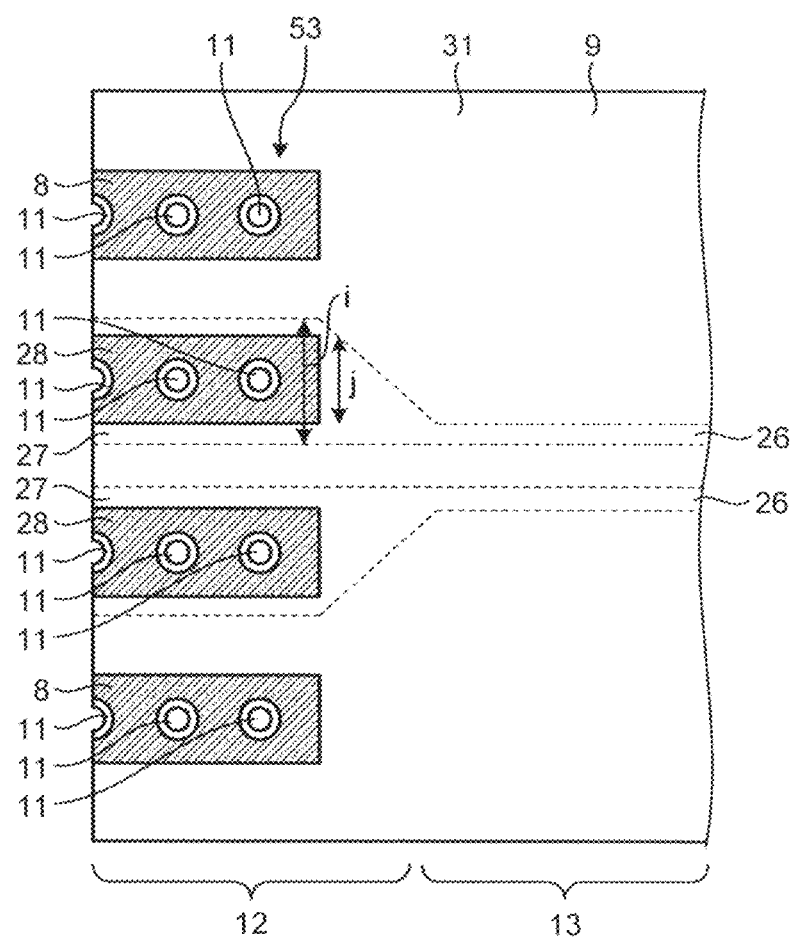
FIG. 14 is a diagram of a pattern layout of the FPC board according to the fourth embodiment of the present invention.
Figure 15:
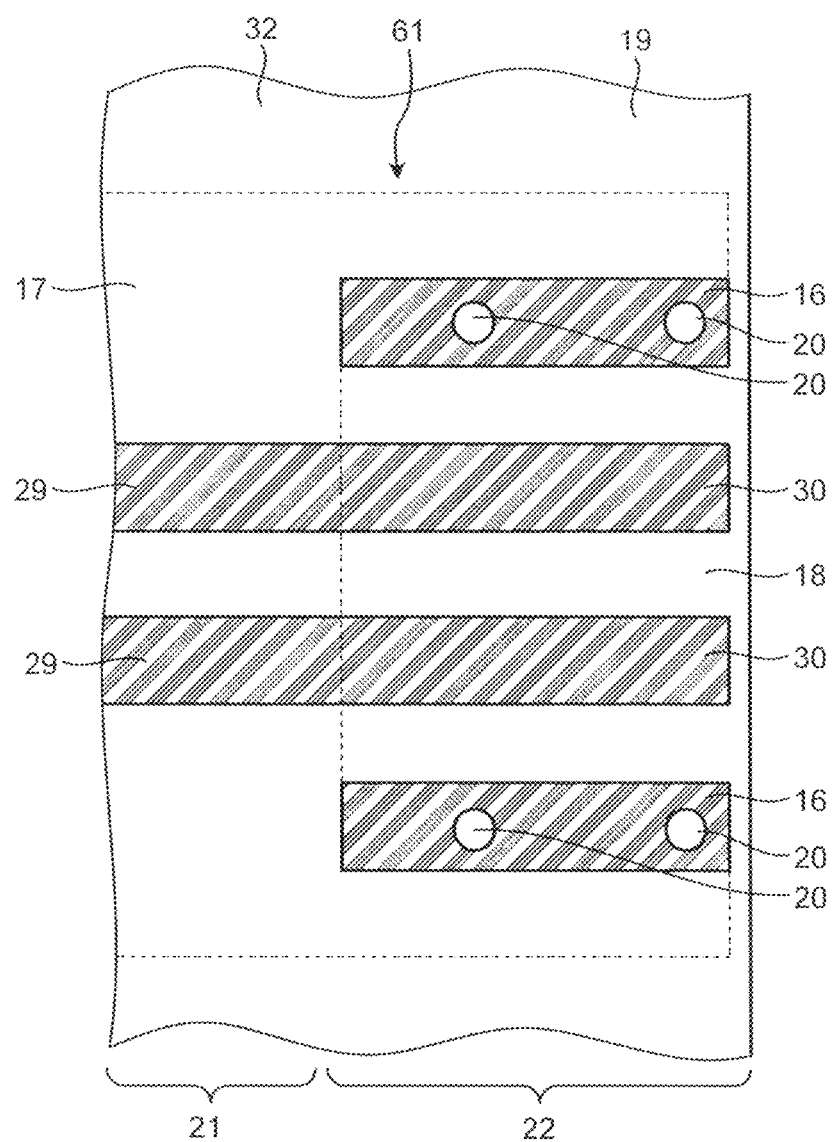
FIG. 15 is a diagram of a pattern layout of a printed circuit board on which the FPC board is mounted.
Figure 16:
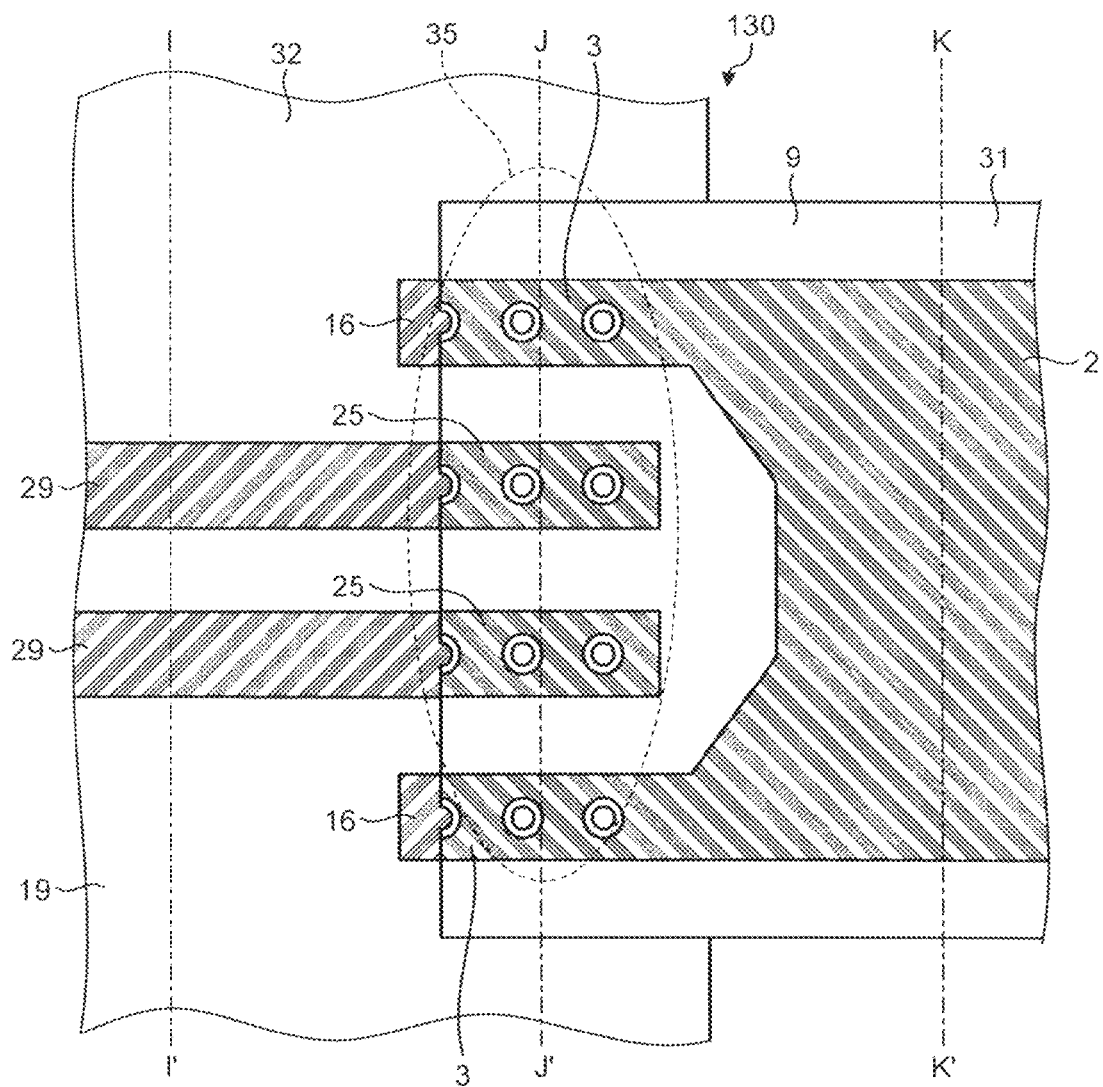
FIG. 16 is a plan view of a configuration of a circuit-board connection structure according to the fourth embodiment of the present invention.
Figure 17A:
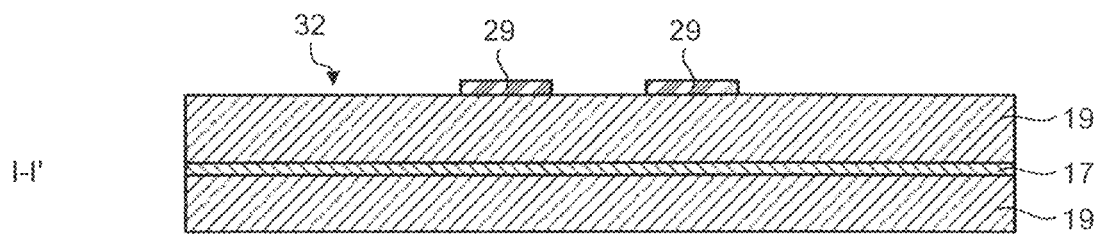
FIG. 17A is a cross-sectional view of a configuration of the circuit-board connection structure according to the fourth embodiment of the present invention.
Figure 17B:
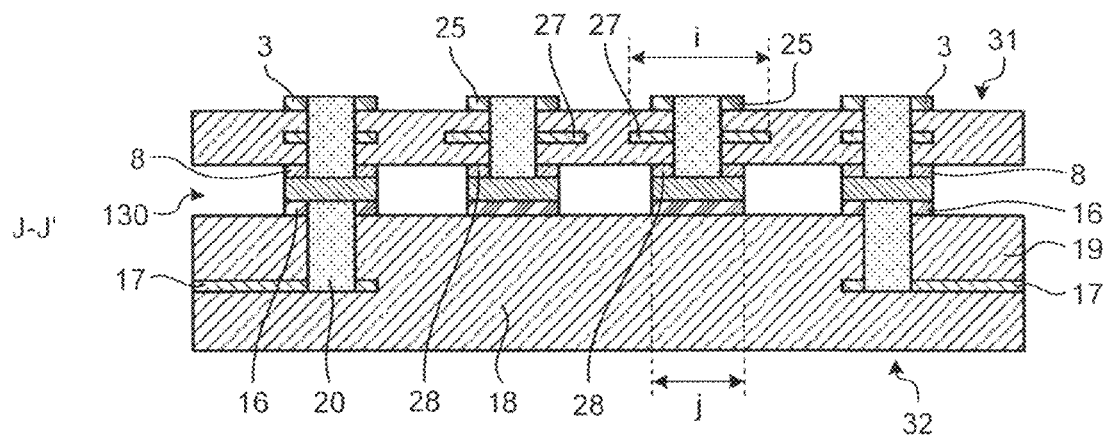
FIG. 17B is a cross-sectional view of a configuration of the circuit-board connection structure according to the fourth embodiment of the present invention.
Figure 17C:
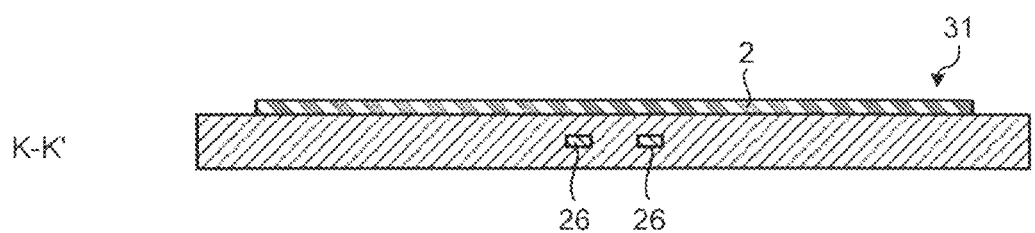
FIG. 17C is a cross-sectional view of a configuration of the circuit-board connection structure according to the fourth embodiment of the present invention.

The overall configuration of a circuit-board connection structure according to a fourth embodiment of the present invention is substantially identical to that of the first embodiment, and therefore only differences between these embodiments are explained below and redundant explanations thereof will be omitted. FIG. 13 is a diagram of a pattern layout of an FPC board according to the fourth embodiment of the present invention, which is viewed from a side that is not solder-mounted on a printed circuit board. FIG. 14 is a diagram of a pattern layout of the FPC board according to the fourth embodiment of the present invention, which is viewed from a side that is solder-mounted on a printed circuit board. FIG. 15 is a diagram of a pattern layout of a printed circuit board on which the FPC board is mounted. FIG. 16 is a plan view of a configuration of a circuit-board connection structure according to the fourth embodiment of the present invention. FIGS. 17A to 17C are cross-sectional views of a configuration of the circuit-board connection structure. FIG. 17A depicts a cross-section taken along line I-I' in FIG. 16, FIG. 17B depicts a cross-section taken along line J-J' in FIG. 16, and FIG. 17C depicts a cross-section taken along line K-K' in FIG. 16.

Differential lines can be applied to the printed circuit board 32 and the FPC board 31. In a circuit-board connection structure 130 according to the fourth embodiment, while layer configurations of the printed circuit board 32 and the FPC board 31 are identical to those in the first embodiment, the transmission line is replaced by differential lines. A pair of printed-circuit-board differential signal lines 29 is placed in the printed-circuit-board transmission line portion 21 and a pair of differential signal lines 26 is placed in the transmission line portion 13. A pair of printed-circuit-board differential signal pads 30 is also provided to correspond to the printed-circuit-board differential signal lines 29. Pairs of differential first signal pads 25, differential second signal pads 27, and differential third signal pads 28 are also provided to correspond to the differential signal lines 26. The differential second signal pads 27 are wider than the differential third signal pads 28.

In the fourth embodiment, a width i of the differential second signal pads 27 is set wider than a width j of the differential third signal pads 28 as i>j, so that the differential second signal pads 27 are coupled with each other, thereby forming an impedance-matched differential transmission line 35 at a connection portion between the terminal portion 12 and the printed-circuit-board terminal portion 22. By increasing the width of the differential second signal pads 27 to be larger than the width of the differential third signal pads 28, an impedance control can be executed without changing the width of the differential third signal pads 28 exposed on the surface of the FPC board 31. Accordingly, satisfactory differential lines can be formed while short circuit with adjacent pads occurring due to mounting positional misalignment during soldering is avoided.

By setting as "i=0.6 millimeter" and "j=0.4 millimeter" as an example, satisfactory differential lines can be formed while short circuit with adjacent pads in which mounting positional misalignment during soldering occurs is avoided.

According to the fourth embodiment, the terminal portion 12 of the FPC board 31 is configured in three layers and the impedance-matched differential transmission line 35 can be formed at the connection portion between the terminal portion 12 and the printed-circuit-board terminal portion 22 while short circuit at the time of occurrence of mounting positional misalignment is avoided. Therefore, a connection of differential signal lines having an excellent high-frequency characteristic and high mountability can be realized.

Fifth Embodiment

Figure 18:
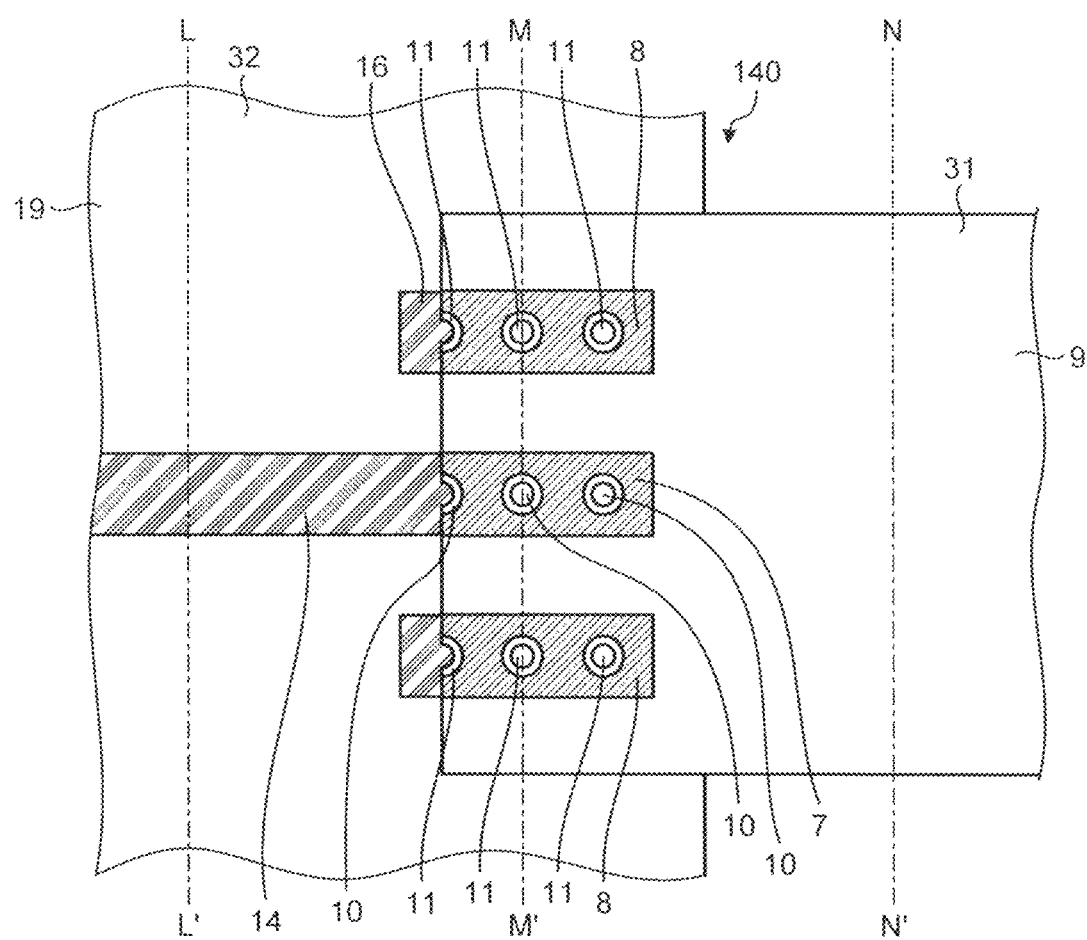
FIG. 18 is a plan view of a configuration of a circuit-board connection structure according to a fifth embodiment of the present invention.
Figure 19A:
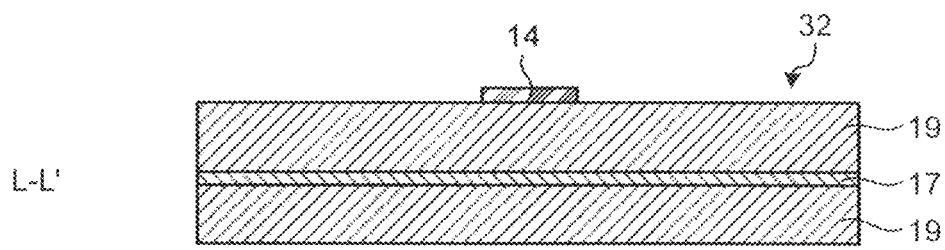
FIG. 19A is a cross-sectional view of a configuration of the circuit-board connection structure according to the fifth embodiment of the present invention.
Figure 19B:
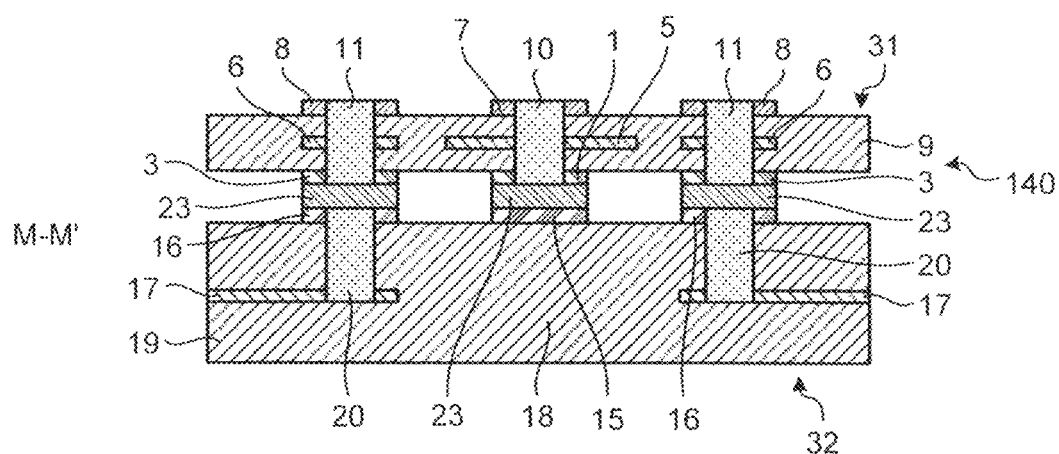
FIG. 19B is a cross-sectional view of a configuration of the circuit-board connection structure according to the fifth embodiment of the present invention.
Figure 19C:
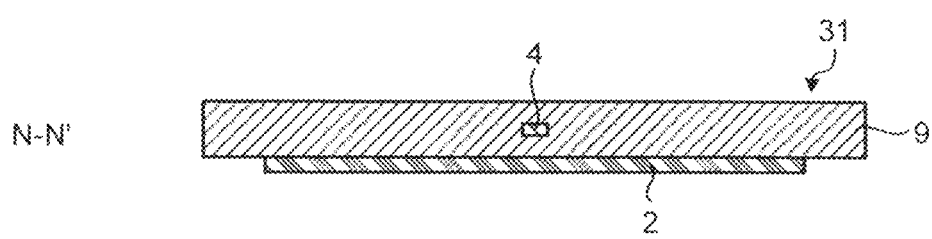
FIG. 19C is a cross-sectional view of a configuration of the circuit-board connection structure according to the fifth embodiment of the present invention.

The overall configuration of a circuit-board connection structure according to a fifth embodiment of the present invention is substantially identical to that of the first embodiment, and therefore only differences between these embodiments are explained below and redundant explanations thereof will be omitted. FIG. 18 is a plan view of a configuration of a circuit-board connection structure according to the fifth embodiment of the present invention. FIGS. 19A to 19C are cross-sectional views of a configuration of the circuit-board connection structure according to the fifth embodiment of the present invention. FIG. 19A depicts a cross-section taken along line L-L' in FIG. 18, FIG. 19B depicts a cross-section taken along line M-M' in FIG. 18, and FIG. 19C depicts a cross-section taken along line N-N' in FIG. 18. A circuit-board connection structure 140 according to the fifth embodiment is different from the circuit-board connection structure 100 according to the first embodiment in that the FPC board 31 illustrated in the first embodiment is reversed and is mounted on the printed circuit board 32.

In the fifth embodiment, the FPC board 31 is reverse mounted when compared to the first embodiment, and thus the surface that contacts the printed circuit board 32 is the surface on which the first signal pad 1 and the first ground pads 3 are provided. As shown in FIG. 19B, the third signal pad 7 and the third ground pads 8 are located on the top side.

In the structure according to the first embodiment, a signal that propagates through the transmission line portion 13 is influenced by the printed-circuit-board dielectric layer 19. At that time, the influence of the printed-circuit-board dielectric layer 19 is larger when the gap between the FPC board 31 and the printed circuit board 32 is smaller, and the influence of the printed-circuit-board dielectric layer 19 is smaller when the gap between the FPC board 31 and the printed circuit board 32 is larger. The influence on a signal that passes through the transmission line portion 13 is thus not constant and a signal that propagates through the transmission line portion 13 is likely to be unstable. In the fifth embodiment, the ground layer 2 is sandwiched between the printed circuit board 32 and the signal line 4 in the transmission line portion 13. Accordingly, a propagation mode of the transmission line portion 13 formed between the signal line 4 and the ground layer 2 is independent of the printed-circuit-board dielectric layer 19 or the printed-circuit-board ground layer 17 and is not influenced by the printed circuit board 32.

According to the fifth embodiment, the stable transmission line portion 13 can be formed regardless of a mounting state such as whether the printed circuit board 32 and the FPC board 31 are in close contact with each other or there is a gap therebetween when the FPC board 31 is mounted on the printed circuit board 32. Therefore, the module output waveform is stabilized.

While a configuration in which the FPC board 31 according to the first embodiment is reversed and mounted on the printed circuit board 32 is explained as an example in this case, the FPC boards 31 according to other embodiments can be reversed and mounted on the printed circuit board 32.

Sixth Embodiment

Figure 20:
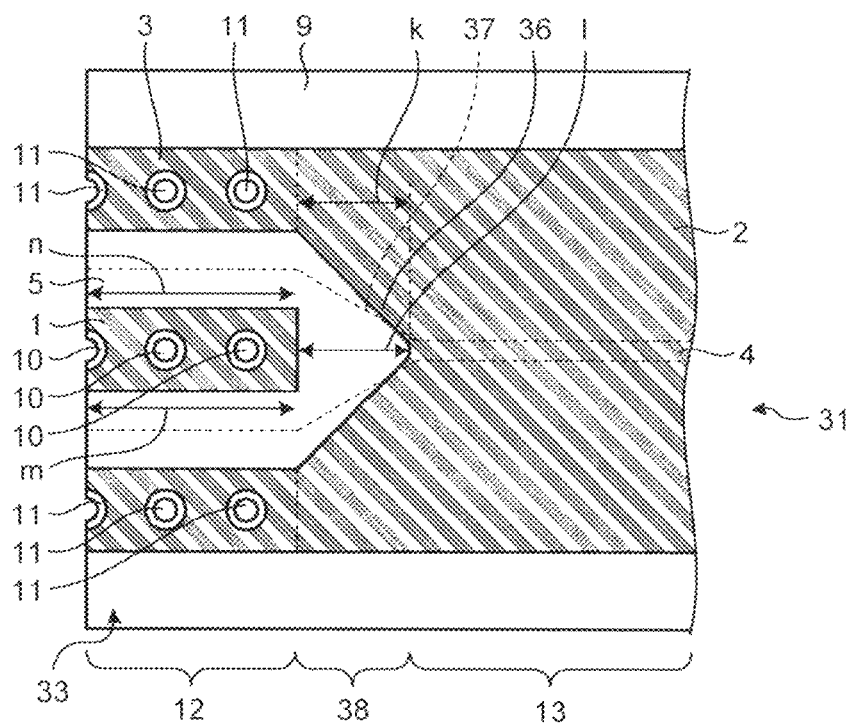
FIG. 20 is a diagram of a pattern layout of an FPC board that is applied to a circuit-board connection structure according to a sixth embodiment of the present invention.
Figure 21:
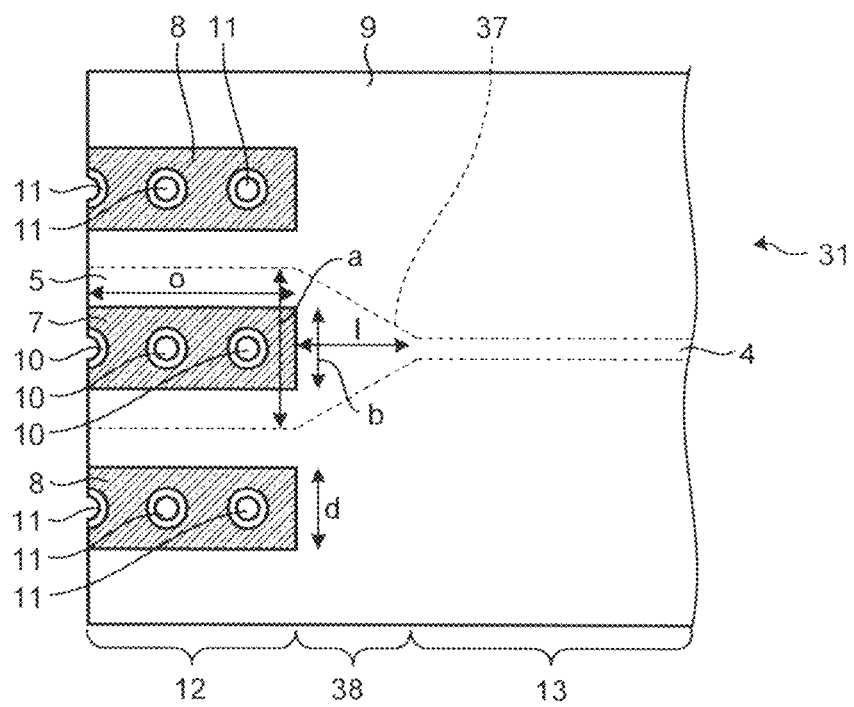
FIG. 21 is a diagram of a pattern layout of the FPC board that is applied to the circuit-board connection structure according to the sixth embodiment of the present invention.

The overall configuration of a circuit-board connection structure according to a sixth embodiment of the present invention is substantially identical to that of the first embodiment, and therefore only differences between these embodiments are explained below and redundant explanations thereof will be omitted. FIG. 20 is a diagram of a pattern layout of an FPC board that is applied to a circuit-board connection structure according to the sixth embodiment of the present invention and depicts a side that is not soldered to a printed circuit board. FIG. 21 is a diagram of a pattern layout of the FPC board that is applied to the circuit-board connection structure according to the sixth embodiment of the present invention and depicts a side that is soldered to a printed circuit board.

According to the sixth embodiment, in the FPC board 31, the terminal portion 12 and the transmission line portion 13 are connected via a tapered portion 38. In the tapered portion 38, the first ground pads 3 and the ground layer 2 are connected via a first ground taper 36 having a width that changes linearly, and the second signal pad 5 and the signal line 4 are connected via a second signal taper 37 having a width that changes linearly. The coplanar transmission line 33 formed in the terminal portion 12 is designed to have a specific impedance and is set to the same impedance as that of the transmission line portion 13. In the sixth embodiment, a length k of the first ground taper 36 is 0.6 millimeter and a length l of the second signal taper 37 is 0.6 millimeter.

In this case, if the corner of the first signal pad 1 or the third signal pad 7 protrudes from the second signal taper 37 or the second signal pad 5, the pathway distance between the signal current and the feedback current decreases at that position, and thus an excess capacitance occurs, which leads to a reduced impedance. By designing a length m of the second signal pad 5 to prevent the corners of the first signal pad 1 and the third signal pad 7 from protruding from the second signal taper 37, the terminal portion 12 and the transmission line portion 13 can be connected to each other without impedance mismatching. In the sixth embodiment, the length m of the second signal pad 5 is set to 1.0 millimeter while a length n of the first signal pad 1 is 1.0 millimeter and a length o of the third signal pad 7 is 1.0 millimeter, so that protrusion of the corner of the first signal pad 1 or the third signal pad 7 from the second signal taper 37 or the second signal pad 5 can be reliably prevented. In the tapered portion 38, the same can be applied when the connection is formed with an arc-like taper or without a taper.

According to the sixth embodiment, impedance mismatching occurring between the terminal portion 12 and the transmission line portion 13 can be eliminated and reflection of a high-frequency signal can be suppressed. Therefore, stability in the output waveform of the optical module can be enhanced and the amount of jitter can be reduced.

Seventh Embodiment

Figure 22:
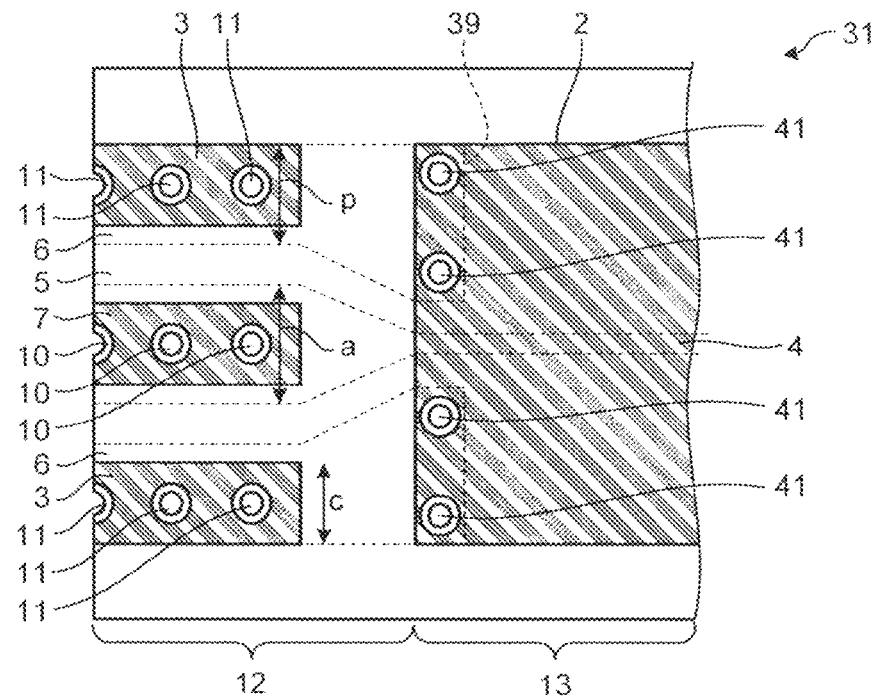
FIG. 22 is a diagram of a pattern layout of an FPC board that is applied to a circuit-board connection structure according to a seventh embodiment of the present invention.
Figure 23:
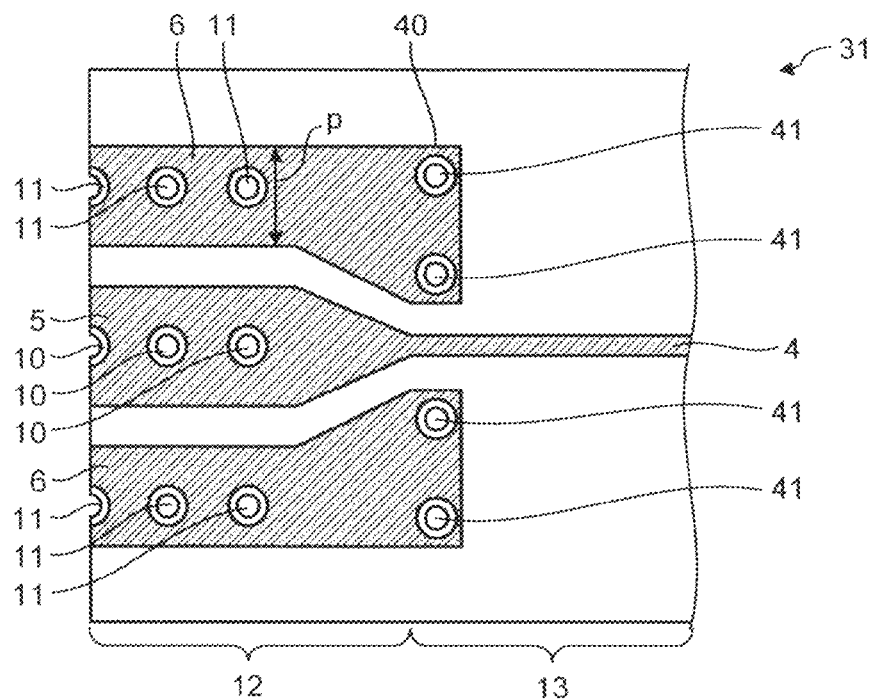
FIG. 23 is a diagram of a pattern layout of the FPC board that is applied to the circuit-board connection structure according to the seventh embodiment of the present invention.
Figure 24:
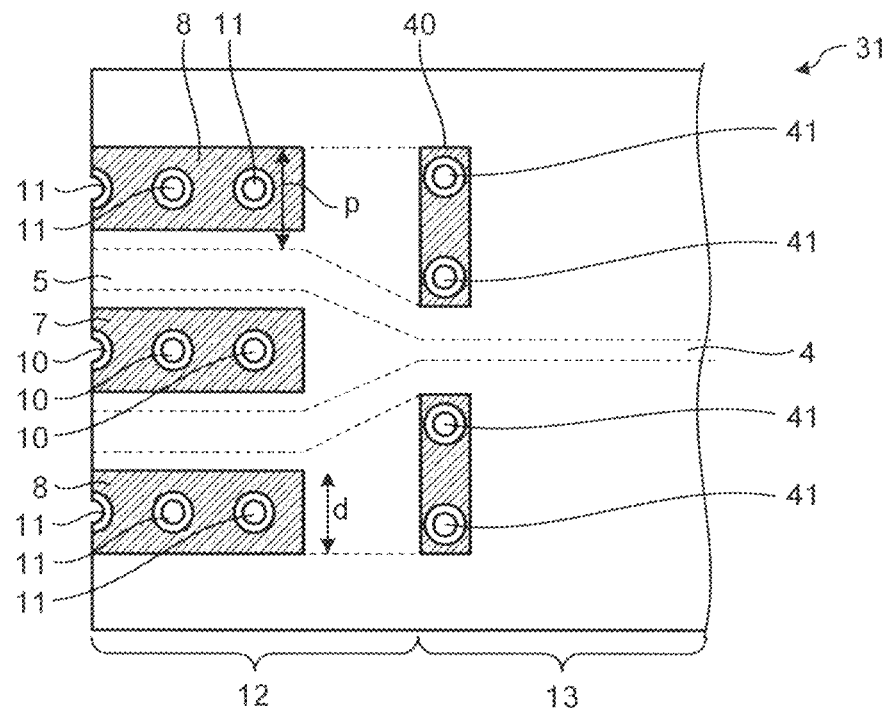
FIG. 24 is a diagram of a pattern layout of the FPC board that is applied to the circuit-board connection structure according to the seventh embodiment of the present invention.

The overall configuration of a circuit-board connection structure according to a seventh embodiment of the present invention is substantially identical to that of the first embodiment, and therefore only differences between these embodiments are explained below and redundant explanations thereof will be omitted. FIG. 22 is a diagram of a pattern layout of an FPC board that is applied to a circuit-board connection structure according to the seventh embodiment of the present invention and depicts a side that is not soldered to a printed circuit board. FIG. 23 is a diagram of a pattern layout of the FPC board that is applied to the circuit-board connection structure according to the seventh embodiment of the present invention, which is a pattern layout of the second conductor layer. FIG. 24 is a diagram of a pattern layout of the FPC board that is applied to the circuit-board connection structure according to the seventh embodiment of the present invention and depicts a side that is soldered to a printed circuit board.

The coplanar transmission line 33 in the terminal portion 12 of the FPC board 31 can be alternatively formed between the second signal pad 5 and the second ground pads 6. In the seventh embodiment, the second ground pads 6 extend to the transmission line portion 13 and are wider than the first ground pads 3 and the third ground pads 8. The second ground pads 6 are arranged to project toward the second signal pad 5. In the transmission line portion 13, the ground layer 2, a second ground layer 39, and a third ground layer 40 are connected through transmission-line ground vias 41. While a microstrip line is formed in the transmission line portion 13 in FIGS. 22 to 24, the microstrip line can be replaced by a grounded coplanar line. While the first ground pads 3 and the ground layer 2 in the first conductor layer 51 are separate patterns, the first ground pads 3 and the ground layer 2 may be connected. The third ground pads 8 and the third ground layer 40 may be also connected.

In the coplanar transmission line 33 in the terminal portion 12, the feedback current flows through the second ground pads 6 that are ground patterns closest to the second signal pad 5, and thus a line is formed between the second signal pad 5 and the second ground pads 6. In the seventh embodiment, a width p of the second ground pads 6 is 0.5 millimeter, the width a of the second signal pad 5 is 0.6 millimeter, the width d of the third ground pads 8 is 0.4 millimeter, and the width c of the first ground pads 3 is 0.4 millimeter.

According to the seventh embodiment, the coplanar transmission line 33 can be formed within the same layer. A pattern tolerance in the same layer is about ±0.01 millimeter and accordingly higher-accuracy manufacturing can be achieved than in the case of an inter-layer-pattern position tolerance of ±0.1 millimeter. Therefore, a more accurate impedance control can be executed.

Eighth Embodiment

Figure 25:
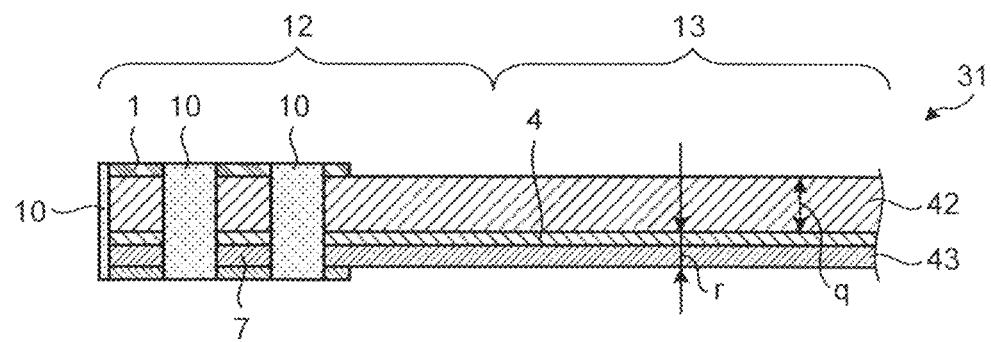
FIG. 25 is a cross-sectional view of an FPC board that is applied to a circuit-board connection structure according to an eighth embodiment of the present invention.

The overall configuration of a circuit-board connection structure according to an eighth embodiment of the present invention is substantially identical to that of the first embodiment, and therefore only differences between these embodiments are explained below and redundant explanations thereof will be omitted. FIG. 25 is a cross-sectional view of an FPC board that is applied to a circuit-board connection structure according to the eighth embodiment of the present invention.

A thickness r of a second dielectric layer 43 located between the second conductor layer 52 and the third conductor layer 53 may be smaller than a thickness q of a first dielectric layer 42 located between the first conductor layer 51 and the second conductor layer 52 that form a microstrip line in the transmission line portion 13.

FIG. 25 assumes a case where a microstrip line with an impedance of 50 ohms is formed in the transmission line portion 13 and the thickness q of the first dielectric layer 42 located between the first conductor layer 51 and the second conductor layer 52 is set to 0.05 millimeter. The second dielectric layer 43 located between the second conductor layer 52 and the third conductor layer 53 is 0.03 millimeter thick and thinner than the first dielectric layer 42. Accordingly, the thickness of the FPC board 31 can be reduced, resulting in a softer FPC board 31. The microstrip line formed in the transmission line portion 13 can be replaced by a coplanar transmission line.

According to the eighth embodiment, the FPC board 31 can be softened, so that mounting of the FPC board 31 on the printed circuit board 32 can be facilitated and the mountability can be enhanced.

Ninth Embodiment

Figure 26:
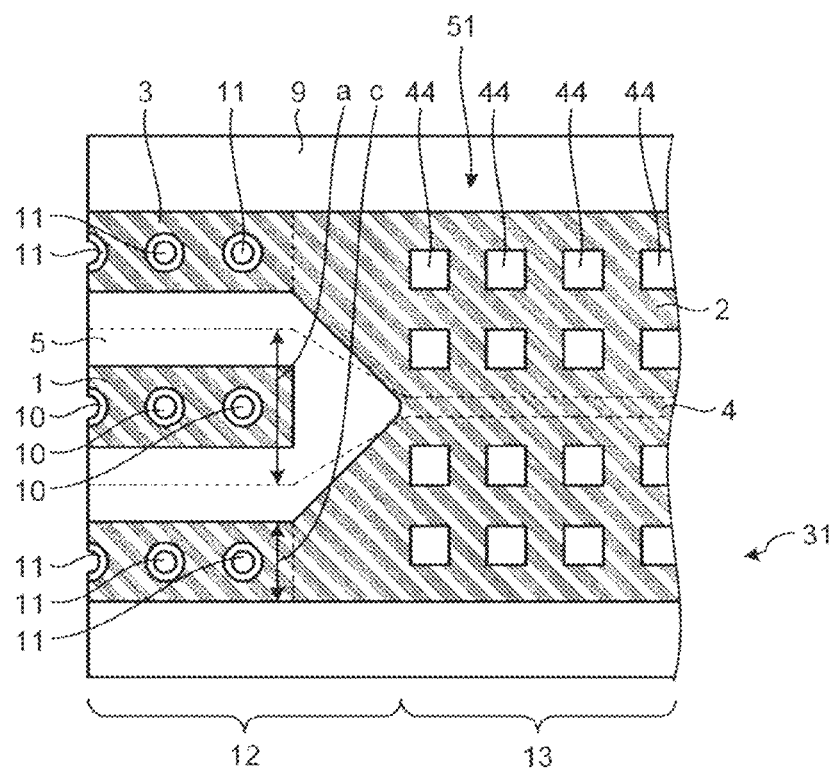
FIG. 26 is a diagram of a pattern layout of an FPC board that is applied to a circuit-board connection structure according to a ninth embodiment of the present invention.

The overall configuration of a circuit-board connection structure according to a ninth embodiment of the present invention is substantially identical to that of the first embodiment, and therefore only differences between these embodiments are explained below and redundant explanations thereof will be omitted. FIG. 26 is a diagram of a pattern layout of an FPC board that is applied to a circuit-board connection structure according to the ninth embodiment of the present invention and depicts a side that is not soldered to a printed circuit board.

In the ninth embodiment, an area of the ground layer 2 where the transmission line portion 13 is formed is partially cut out to form ground-layer removed portions 44 in the first conductor layer 51. A case where the ground layer 2 that forms the transmission line portion 13 is cut out in a mesh form is shown as an example. That is, the ground layer 2 that forms the transmission line portion 13 is partially removed at a plurality of positions.

The FPC board 31 shown in FIG. 26 includes the ground-layer removed portions 44. By providing the ground-layer removed portions 44, the pattern area can be reduced and the FPC board 31 can be softened. While the ground-layer removed portions 44 are square in FIG. 26, the shapes of the ground-layer removed portions 44 may be changed to rectangles, circles, or the like.

According to the ninth embodiment, the FPC board 31 is softened, so that mounting of the FPC board 31 on the printed circuit board 32 can be facilitated and the mountability can be enhanced.

Tenth Embodiment

Figure 27:
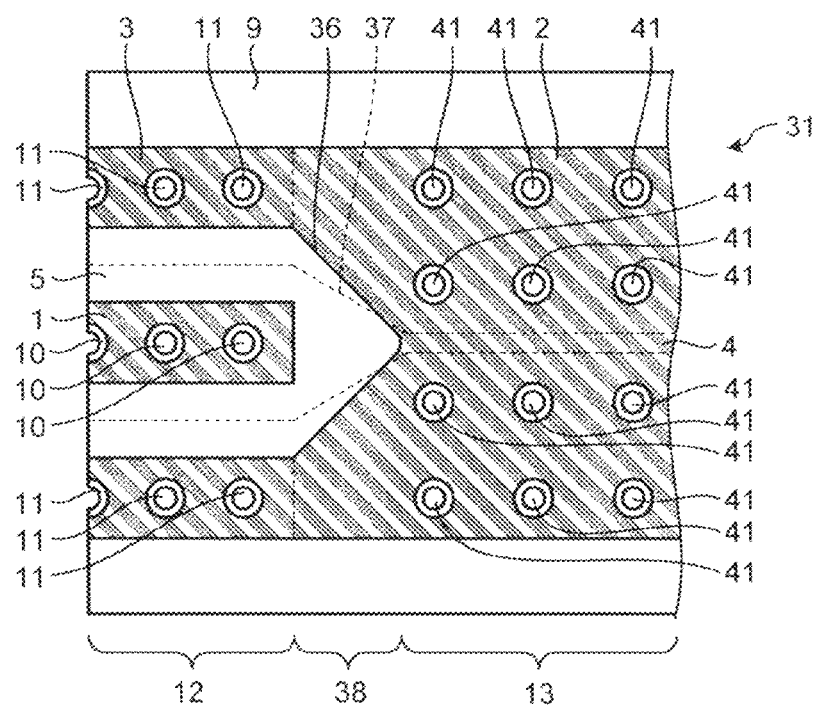
FIG. 27 is a diagram of a pattern layout of an FPC board that is applied to a circuit-board connection structure according to a tenth embodiment of the present invention.
Figure 28:
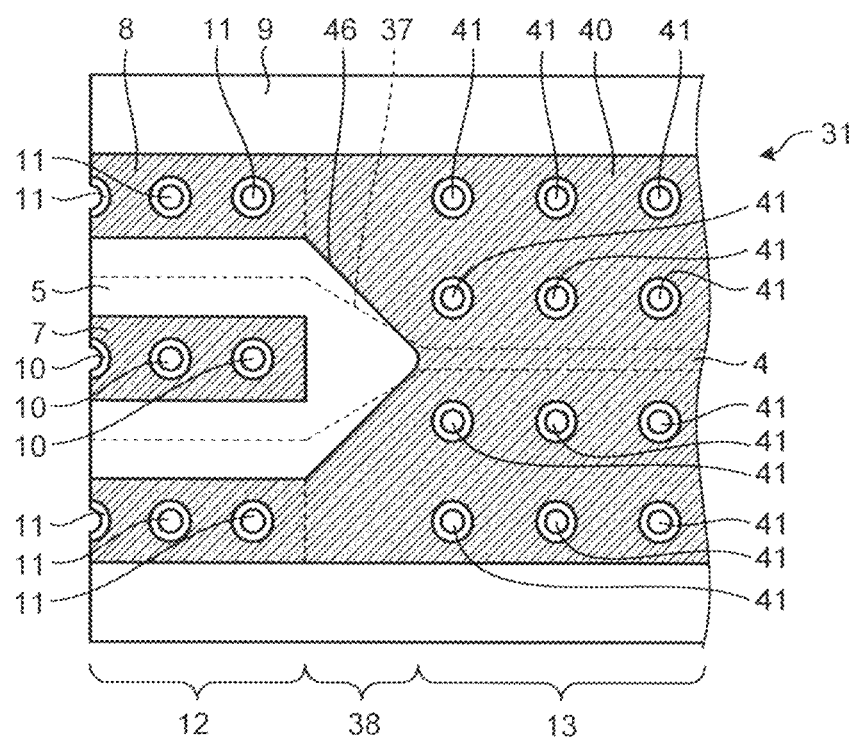
FIG. 28 is a diagram of a pattern layout of the FPC board that is applied to the circuit-board connection structure according to the tenth embodiment of the present invention.

The overall configuration of a circuit-board connection structure according to a tenth embodiment of the present invention is substantially identical to that of the first embodiment, and therefore only differences between these embodiments are explained below and redundant explanations thereof will be omitted. FIG. 27 is a diagram of a pattern layout of an FPC board that is applied to a circuit-board connection structure according to the tenth embodiment of the present invention and depicts a side that is not soldered to a printed circuit board. FIG. 28 is a diagram of a pattern layout of the FPC board that is applied to the circuit-board connection structure according to the tenth embodiment of the present invention and depicts a side that is soldered to a printed circuit board.

According to the tenth embodiment, with respect to the FPC board 31 according to the first embodiment, the first ground pads 3 and the third ground pads 8, and the first signal pad 1 and the third signal pad 7 are formed in the same shapes, respectively, and the third ground layer 40 in the same shape as the ground layer 2 is newly added, so that the front and back sides have the same structure in the FPC board 31. Accordingly, a strip transmission line is formed in the transmission line portion 13. The ground layer 2 and the third ground layer 40 are electrically connected to each other through the transmission-line ground vias 41. The terminal portion 12 and the transmission line portion 13 are connected via the tapered portion 38. In the tapered portion 38, the first ground pads 3 and the ground layer 2 are connected via the first ground taper 36 having a width that changes linearly, the second signal pad 5 and the signal line 4 are connected via the second signal taper 37 having a width that changes linearly, and the third ground pads 8 and the third ground layer 40 are connected via a third ground taper 46 having a width that changes linearly.

While a microstrip line is formed between the ground layer 2 and the signal line 4 in the transmission line portion 13 according to the first embodiment, a strip line having the signal line 4 sandwiched between the ground layer 2 and the third ground layer 40 is formed in the transmission line portion 13 according to the tenth embodiment.

Because the FPC board 31 is configured such that the front and back sides thereof have the same structure according to the tenth embodiment, the front and back sides thereof can have the same high-frequency characteristic for the printed circuit board 32, and thus the FPC boards 31 that are in the same design can be used regardless of positional relationships between the printed circuit board 32 and the FPC board 31. Furthermore, because upper and lower layers of the signal line 4 are the ground layer 2 and the third ground layer 40, respectively, electromagnetic interference emission can be suppressed and influences of external noise can be removed.

In the tenth embodiment, the ground-layer removed portions explained in the ninth embodiment may be provided also in the third ground layer 40.

Eleventh Embodiment

Figure 29:
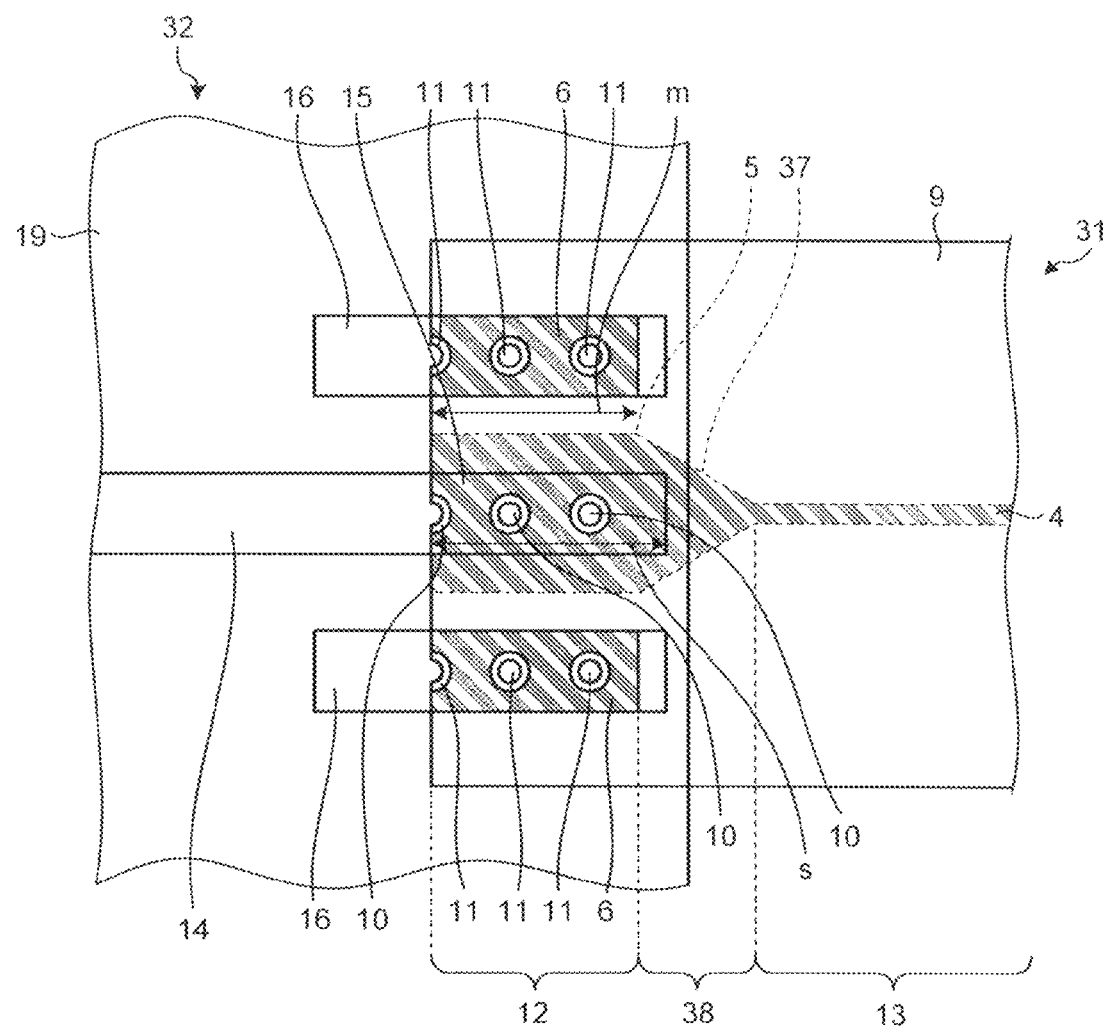
FIG. 29 is a plan view of a configuration of a circuit-board connection structure according to an eleventh embodiment of the present invention.

The overall configuration of a circuit-board connection structure according to an eleventh embodiment of the present invention is substantially identical to that of the first embodiment, and therefore only differences between these embodiments are explained below and redundant explanations thereof will be omitted. FIG. 29 is a plan view of a configuration of a circuit-board connection structure according to the eleventh embodiment of the present invention.

The length m of the second signal pad 5 is defined to prevent the printed-circuit-board signal pad 15 from protruding from the second signal pad 5 or the second signal taper 37.

In the eleventh embodiment, the FPC board 31 having the tapered portion 38 between the terminal portion 12 and the transmission line portion 13 is shown. When the printed-circuit-board signal pad 15 has a large length s of a portion overlapping with the FPC board 31 and protrudes from the second signal taper 37, the pathway distance between the signal current and the feedback current decreases at that position, and thus an excess capacitance occurs, which leads to a reduced impedance. Also, in a configuration without the tapered portion 38, when the printed-circuit-board signal pad 15 protrudes from the second signal pad 5, an unexpected capacitance component occurs. By designing the length m to prevent the corners of the printed-circuit-board signal pad 15 from protruding from the second signal taper 37 or the second signal pad 5, the terminal portion 12 and the transmission line portion 13 can be connected to each other without impedance mismatching. In FIG. 29, "m=1 millimeter" while the length of a portion of the printed-circuit-board signal pad 15 overlapping with the FPC board 31 is 1.2 millimeters. It is unnecessary that the corners of the printed-circuit-board signal pad 15 have an angle of 90 degrees and the corners may be chamfered in an arc shape having a radius of 0.2 millimeter or smaller (a half of the width "e=0.4 millimeter" of the printed-circuit-board ground pads 16) or chamfered to form a straight line having a length of 0.2 millimeter or smaller to prevent protrusion of the corners of the printed-circuit-board signal pad 15 from the second signal taper 37.

According to the eleventh embodiment, impedance mismatching at the tapered portion 38 can be prevented and reflection of the high-frequency signal can be suppressed. Therefore, an output waveform of the optical module can be stabilized and the amount of jitter can be reduced.

Twelfth Embodiment

Figure 30:
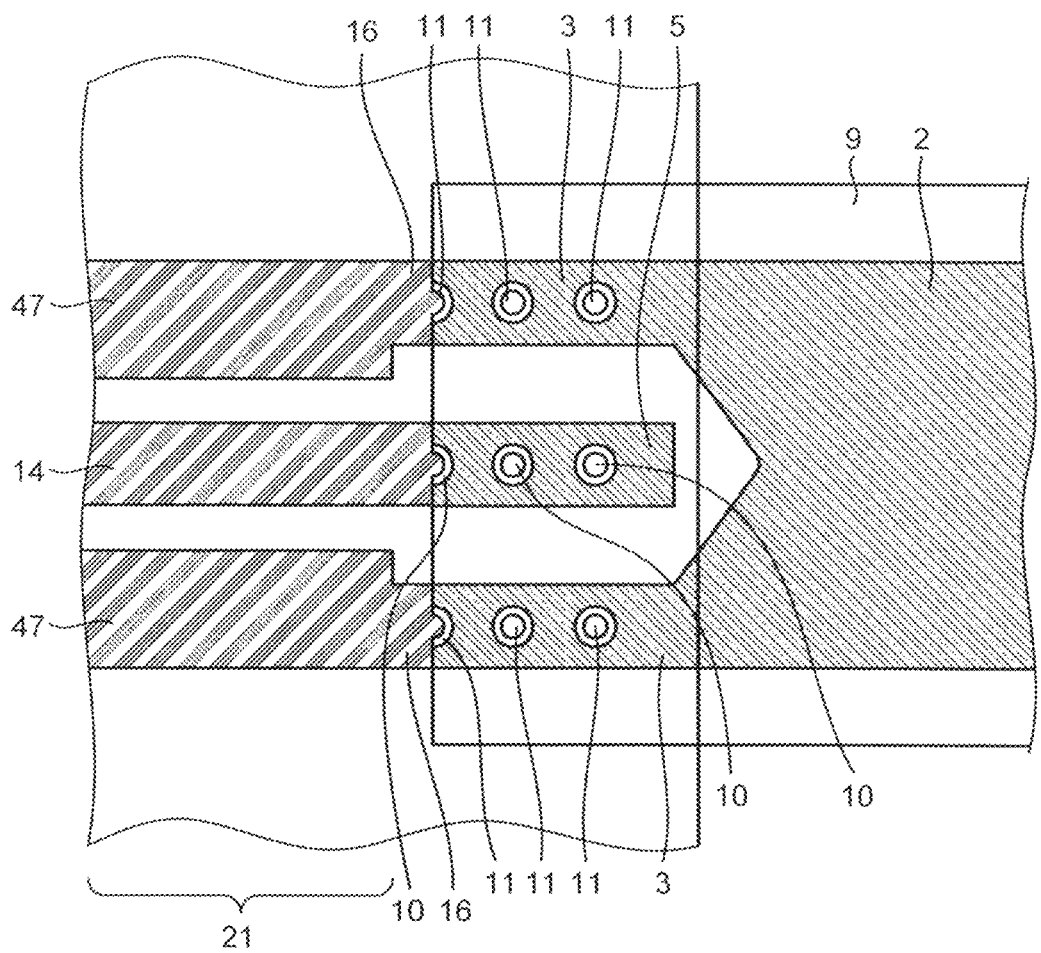
FIG. 30 is a plan view of a configuration of a circuit-board connection structure according to a twelfth embodiment of the present invention.

The overall configuration of a circuit-board connection structure according to a twelfth embodiment of the present invention is substantially identical to that of the first embodiment, and therefore only differences between these embodiments are explained below and redundant explanations thereof will be omitted. FIG. 30 is a plan view of a configuration of a circuit-board connection structure according to the twelfth embodiment of the present invention.

With respect to the printed circuit board 32 shown in the first embodiment, a coplanar line may be formed in the printed-circuit-board transmission line portion 21. While the microstrip line is formed in the printed-circuit-board transmission line portion 21 in the first embodiment, parallel printed-circuit-board ground lines 47 are added on both sides of the printed-circuit-board signal line 14 to form the coplanar line in the printed-circuit-board transmission line portion 21.

According to the twelfth embodiment shown in FIG. 30, the coplanar transmission line can be formed by adding the close printed-circuit-board ground lines 47 on both sides of the printed-circuit-board signal line 14, and thus both of the feedback current and the signal current flow through the first printed-circuit-board conductor layer 61. Because the coplanar transmission line 33 is formed at the connection portion between the terminal portion 12 and the printed-circuit-board terminal portion 22, electric-field distribution mismatch with the printed-circuit-board transmission line portion 21 is reduced and an impedance-matched connection is obtained. Furthermore, formation of the coplanar transmission line in the printed-circuit-board transmission line portion 21 prevents an influence of the printed-circuit-board ground layer 17 formed in the second printed-circuit-board conductor layer 62 from easily affecting, and thus the printed-circuit-board ground-layer removed portion 18 shown in the first embodiment can be eliminated.

According to the twelfth embodiment, reflection caused by the electric-field distribution mismatch between the printed-circuit-board terminal portion 22 and the terminal portion 12 can be suppressed and therefore an output waveform of the optical module can be stabilized and the amount of jitter can be reduced.

Thirteenth Embodiment

The overall configuration of a circuit-board connection structure according to a thirteenth embodiment of the present invention is substantially identical to that of the first embodiment, and therefore only differences between these embodiments are explained below and redundant explanations thereof will be omitted.

The layers of the FPC board 31 having the coplanar transmission line formed in the terminal portion 12 may be increased to five or more layers.

According to the thirteenth embodiment, formation of the coplanar transmission line 33 provides impedance matching in the terminal portion 12 of the FPC board 31. Furthermore, by increasing the layers of the FPC board 31 to five or more layers, a power-supply line and the like formed on the same FPC board can be intersected with each other on the FPC board 31, resulting in an increased flexibility in design.

Fourteenth Embodiment

The overall configuration of a circuit-board connection structure according to a fourteenth embodiment of the present invention is substantially identical to that of the first embodiment, and therefore only differences between these embodiments are explained below and redundant explanations thereof will be omitted.

While the FPC board 31 is connected to the printed circuit board 32 via the solder 23, the FPC board 31 may be fixed to the printed circuit board 32 using an adhesive, a connector, or the like, as a method of bringing the FPC board into contact with the printed circuit board.

According to the fourteenth embodiment, the FPC board can be fixed to the printed circuit board at a lower temperature than in the case of soldering that heats the FPC board and the printed circuit board to a high temperature and the manufacturing process can be simplified. Furthermore, when a connector is used, detachment becomes possible and thus replacement of the FPC board can be easily performed.

According to the present invention, a connection with low reflection between an FPC board and a printed circuit board can be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A flexible printed circuit board having a multilayer structure in which first, second, and third conductor layers are stacked with a dielectric layer therebetween, the flexible printed circuit board comprising:
    a terminal portion configured to obtain an electrical connection with a printed circuit board; and
    a transmission line portion having a transmission line to be connected to the printed circuit board through the terminal portion formed therein, wherein
    the transmission line is formed of a ground layer formed in the first conductor layer and a signal line formed in the second conductor layer in parallel with the ground layer,
    the terminal portion includes
        a first signal pad that is formed in the first conductor layer and is electrically separated from the ground layer,
        a pair of first ground pads that is formed in the first conductor layer and is arranged such that the first ground pads sandwich the first signal pad from both sides thereof,
        a second signal pad that is formed in the second conductor layer such that the second signal pad is connected to the signal line,
        a pair of second ground pads that is formed in the second conductor layer, is electrically separated from the signal line, and is arranged such that the second ground pads sandwich the second signal pad from both sides thereof,
        a third signal pad that is formed in the third conductor layer,
        a pair of third ground pads that is formed in the third conductor layer and is arranged such that the third ground pads sandwich the third signal pad from both sides thereof,
        a ground via that connects the first ground pads, the second ground pads, and the third ground pads with each other, and
        a signal via that connects the first signal pad, the second signal pad, and the third signal pad with each other,
    the pairs of first, second, and third ground pads are electrically connected to the ground layer, and
    the second signal pad is wider than the third signal pad.

2. The flexible printed circuit board according to claim 1, wherein the transmission line is a differential line including two signal lines.

3. The flexible printed circuit board according to claim 1, wherein the second signal pad is wider than the signal line, and a width of a conductor between the second signal pad and the signal line changes continuously.

4. The flexible printed circuit board according to claim 1, wherein the first signal pad and the third signal pad are formed not to protrude from the second signal pad.

5. The flexible printed circuit board according to claim 1, wherein the dielectric layer formed between the second conductor layer and the third conductor layer is thinner than the dielectric layer formed between the first conductor layer and the second conductor layer.

6. The flexible printed circuit board according to claim 1, wherein the ground layer is partially removed at a plurality of positions.

7. The flexible printed circuit board according to claim 1, wherein the flexible printed circuit board is a multilayer circuit board including five or more layers.

8. The flexible printed circuit board according to claim 1, wherein
the first signal pad and the third signal pad have a same shape, and the pair of first ground pads and the pair of third ground pads have a same shape, and
the transmission line portion includes a ground layer having a same shape as the ground layer formed in the first conductor layer, in the third conductor layer.

9. The flexible printed circuit board according to claim 1, wherein the transmission line portion has no conductor formed in the third conductor layer.

10. The flexible printed circuit board according to claim 1, wherein the ground layer is wider than the signal line.

11. The flexible printed circuit board according to claim 10, wherein
the pair of first ground pads extends to the transmission line portion, and the pair of first ground pads and the ground layer are connected to each other in the first conductor layer, and
each of the first ground pads is wider than each of the third ground pads and is arranged such that the pair of first ground pads projects toward the first signal pad.

12. The flexible printed circuit board according to claim 10, wherein
the pair of second ground pads extends to the transmission line portion,
the transmission line portion includes a transmission-line-portion ground via that connects the pair of second ground pads and the ground layer, and
each of the second ground pads is wider than each of the first ground pads and each of the third ground pads and is arranged such that the pair of second ground pads projects toward the second signal pad.

13. The flexible printed circuit board according to claim 1, further comprising a fourth conductor layer that is stacked on a side of the first conductor layer with a dielectric layer therebetween, the side being opposite to a side on which the second conductor layer is stacked, wherein
the terminal portion includes
a fourth signal pad that is formed in the fourth conductor layer and is connected to the first signal pad, the second signal pad, and the third signal pad through the signal via, and
a pair of fourth ground pads that is formed in the fourth conductor layer and is connected to the pair of first ground pads, the pair of second ground pads, and the pair of third ground pads through the ground via, and
an interval between the pair of fourth ground pads and the fourth signal pad is larger than an interval between the pair of first ground pads and the first signal pad.

14. A circuit-board connection structure comprising:
a printed circuit board having a multilayer structure in which first and second printed-circuit-board conductor layers are provided to be stacked with a printed-circuit-board dielectric layer therebetween; and
the flexible printed circuit board according to claim 1, wherein
the printed circuit board and the flexible printed circuit board are connected to each other,
the printed circuit board includes
a printed-circuit-board terminal portion configured to obtain an electrical connection with the flexible printed circuit board, and
a printed-circuit-board transmission line portion having a printed-circuit-board transmission line to be connected to the flexible printed circuit board through the printed-circuit-board terminal portion formed therein,
the printed-circuit-board transmission line is formed of a printed-circuit-board signal line and a printed-circuit-board ground layer,
the printed-circuit-board terminal portion includes
a printed-circuit-board signal pad that is formed in the first printed-circuit-board conductor layer and is connected to the printed-circuit-board signal line, and
a pair of printed-circuit-board ground pads that is formed in the first printed-circuit-board conductor layer such that the printed-circuit-board ground pads sandwich the printed-circuit-board signal pad from both sides thereof and is connected to the printed-circuit-board ground layer, and
the printed-circuit-board signal pad and the third signal pad are electrically connected, and the pair of printed-circuit-board ground pads and the pair of third ground pads are electrically connected.

15. A circuit-board connection structure comprising:
a printed circuit board having a multilayer structure in which first and second printed-circuit-board conductor layers are provided to be stacked with a printed-circuit-board dielectric layer therebetween; and
the flexible printed circuit board according to claim 1, wherein
the printed circuit board and the flexible printed circuit board are connected to each other,
the printed circuit board includes
a printed-circuit-board terminal portion configured to obtain an electrical connection with the flexible printed circuit board, and
a printed-circuit-board transmission line portion having a printed-circuit-board transmission line to be connected to the flexible printed circuit board through the printed-circuit-board terminal portion formed therein,
the printed-circuit-board transmission line is formed of a printed-circuit-board signal line and a printed-circuit-board ground layer,
the printed-circuit-board terminal portion includes
a printed-circuit-board signal pad that is formed in the first printed-circuit-board conductor layer and is connected to the printed-circuit-board signal line, and
a pair of printed-circuit-board ground pads that is formed in the first printed-circuit-board conductor layer such that the printed-circuit-board ground pads sandwich the printed-circuit-board signal pad from both sides thereof and is connected to the printed-circuit-board ground layer, and the printed-circuit-board signal pad and the first signal pad are electrically connected, and the pair of printed-circuit-board ground pads and the pair of first ground pads are electrically connected.

16. A circuit-board connection structure comprising:
a printed circuit board having a multilayer structure in which first and second printed-circuit-board conductor layers are provided to be stacked with a printed-circuit-board dielectric layer therebetween; and
the flexible printed circuit board according to claim 13, wherein
the printed circuit board and the flexible printed circuit board are connected to each other,
the printed circuit board includes
a printed-circuit-board terminal portion configured to obtain an electrical connection with the flexible printed circuit board, and
a printed-circuit-board transmission line portion having a printed-circuit-board transmission line to be connected to the flexible printed circuit board through the printed-circuit-board terminal portion formed therein,
the printed-circuit-board transmission line is formed of a printed-circuit-board signal line and a printed-circuit-board ground layer,
the printed-circuit-board terminal portion includes
a printed-circuit-board signal pad that is formed in the first printed-circuit-board conductor layer and is connected to the printed-circuit-board signal line, and
a pair of printed-circuit-board ground pads that is formed in the first printed-circuit-board conductor layer such that the printed-circuit-board ground pads sandwich the printed-circuit-board signal pad from both sides thereof and is connected to the printed-circuit-board ground layer, and
the printed-circuit-board signal pad and the fourth signal pad are electrically connected, and the pair of printed-circuit-board ground pads and the pair of fourth ground pads are electrically connected.

17. The circuit-board connection structure according to claim 14, wherein
the printed-circuit-board signal line is formed in the first printed-circuit-board conductor layer, and the printed-circuit-board ground layer is formed in the second printed-circuit-board conductor layer such that the printed-circuit-board ground layer is wider than the printed-circuit-board signal line, and
the printed-circuit-board terminal portion includes a printed-circuit board ground via that connects the pair of printed-circuit-board ground pads and the printed-circuit-board ground layer.

18. The circuit-board connection structure according to claim 15, wherein
the printed-circuit-board signal line is formed in the first printed-circuit-board conductor layer, and the printed-circuit-board ground layer is formed in the second printed-circuit-board conductor layer such that the printed-circuit-board ground layer is wider than the printed-circuit-board signal line, and
the printed-circuit-board terminal portion includes a printed-circuit board ground via that connects the pair of printed-circuit-board ground pads and the printed-circuit-board ground layer.

19. The circuit-board connection structure according to claim 14, wherein the printed-circuit-board signal line is formed in the first printed-circuit-board conductor layer, and the printed-circuit-board ground layer is formed in the first printed-circuit-board conductor layer such that the printed-circuit-board ground layer sandwiches the printed-circuit-board signal line from both sides thereof.

20. The circuit-board connection structure according to claim 15, wherein the printed-circuit-board signal line is formed in the first printed-circuit-board conductor layer, and the printed-circuit-board ground layer is formed in the first printed-circuit-board conductor layer such that the printed-circuit-board ground layer sandwiches the printed-circuit-board signal line from both sides thereof.

21. The circuit-board connection structure according to claim 14, wherein the printed circuit board and the flexible printed circuit board are connected in such a manner that the printed-circuit-board signal pad does not protrude from the second signal pad.

22. The circuit-board connection structure according to claim 15, wherein the printed circuit board and the flexible printed circuit board are connected in such a manner that the printed-circuit-board signal pad does not protrude from the second signal pad.

* * * * *